United States Patent
Kim et al.

(10) Patent No.: US 9,978,752 B2
(45) Date of Patent: May 22, 2018

(54) THREE-DIMENSIONAL (3D) SEMICONDUCTOR MEMORY DEVICES

(71) Applicants: Kyoung-Hoon Kim, Seoul (KR); Sangyoun Jo, Suwon-si (KR)

(72) Inventors: Kyoung-Hoon Kim, Seoul (KR); Sangyoun Jo, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days. days.

(21) Appl. No.: 15/373,922

(22) Filed: Dec. 9, 2016

(65) Prior Publication Data

US 2017/0207221 A1 Jul. 20, 2017

(30) Foreign Application Priority Data

Jan. 15, 2016 (KR) .......................... 10-2016-0005548

(51) Int. Cl.
*H01L 29/66* (2006.01)
*H01L 27/105* (2006.01)
*H01L 23/528* (2006.01)
*G11C 16/04* (2006.01)

(52) U.S. Cl.
CPC ...... *H01L 27/1052* (2013.01); *H01L 23/5283* (2013.01); *G11C 16/0483* (2013.01)

(58) Field of Classification Search
CPC .................................................. H01L 27/1052
USPC .......................... 257/208, 211, 329, E27.121
See application file for complete search history.

(56) References Cited

U.S. PATENT DOCUMENTS

| | | | |
|---|---|---|---|
| 8,325,527 B2 | 12/2012 | Jin et al. | |
| 8,503,213 B2 | 8/2013 | Chen et al. | |
| 8,592,890 B2 | 11/2013 | Watanabe et al. | |
| 8,680,604 B2 | 3/2014 | Higashi et al. | |
| 8,953,376 B2 | 2/2015 | Nam et al. | |
| 2012/0119287 A1* | 5/2012 | Park .................. | H01L 27/11519 257/329 |
| 2012/0224426 A1* | 9/2012 | Nam .................. | G11C 16/0483 365/185.11 |
| 2012/0327714 A1 | 12/2012 | Lue | |
| 2014/0197546 A1 | 7/2014 | Hwang et al. | |
| 2014/0203442 A1* | 7/2014 | Yun ........................ | G11C 5/063 257/773 |

* cited by examiner

*Primary Examiner* — Robert Huber
(74) *Attorney, Agent, or Firm* — Myers Bigel, P.A.

(57) ABSTRACT

A three-dimensional (3D) semiconductor memory device may include a substrate including a cell array region and a connection region, an electrode structure including pluralities of first and second electrodes that are vertically and alternately stacked on a surface of the substrate, extending in a first direction that is parallel to the surface of the substrate, and may include a stair step structure on the connection region, first and second string selection electrodes that extend in the first direction on the electrode structure and spaced apart from each other in a second direction that is parallel to the surface of the substrate and perpendicular to the first direction. The first and second string selection electrodes may each include an electrode portion on the cell array region and a pad portion that extends from the electrode portion in the first direction and on the connection region. Widths in the second direction of the pad portions may be different from widths in the second direction of the respective electrode portions.

20 Claims, 25 Drawing Sheets

THREE-DIMENSIONAL (3D) SEMICONDUCTOR MEMORY DEVICES

CROSS-REFERENCE TO RELATED APPLICATION

This U.S. non-provisional patent application claims priority under 35 U.S.C. § 119 to Korean Patent Application No. 10-2016-0005548, filed on Jan. 15, 2016, in the Korean Intellectual Property Office, the disclosure of which is hereby incorporated by reference in its entirety.

BACKGROUND

Embodiments of the inventive concepts relate to three-dimensional (3D) semiconductor devices and, more particularly, to highly integrated 3D semiconductor memory devices.

Semiconductor devices may be highly integrated to provide excellent performance and low manufacture costs. The integration density of semiconductor devices may directly affect costs of the semiconductor devices, and may thereby result in a demand of highly integrated semiconductor devices. The integration density of a conventional two-dimensional (2D) or planar semiconductor devices may be mainly determined by an area where a unit memory cell occupies. Therefore, the integration density of the conventional 2D semiconductor devices may be affected by a technique of forming fine patterns. However, since extremely high-priced apparatuses may be needed to form fine patterns, the integration density of 2D semiconductor devices may continue to increase but may still be limited. Thus, three-dimensional (3D) semiconductor memory devices have been developed to improve over the above limitations. 3D semiconductor memory devices may include memory cells three-dimensionally arranged.

SUMMARY

According to some embodiments of the inventive concepts, three-dimensional (3D) semiconductor memory devices capable of improving an integration density may be provided.

According to some embodiments of the inventive concepts, three-dimensional (3D) semiconductor memory devices may be provided. A 3D semiconductor memory device may include a substrate including a cell array region and a connection region. The 3D semiconductor memory device may include an electrode structure including pluralities of first and second electrodes that are vertically and alternately stacked on a surface of the substrate. The electrode structure may extend in a first direction that is parallel to the surface of the substrate. The electrode structure may include a stair step structure on the connection region. The 3D semiconductor memory device may include first and second string selection electrodes that extend in the first direction on the electrode structure. The first and second string selection electrodes may be spaced apart from each other in a second direction that is parallel to the surface of the substrate and perpendicular to the first direction. The first and second string selection electrodes may each include an electrode portion on the cell array region and a pad portion that extends from the electrode portion in the first direction and on the connection region. Widths in the second direction of the pad portions may be different from widths in the second direction of the respective electrode portions.

According to some embodiments of the inventive concepts, three-dimensional (3D) semiconductor memory devices may be provided. A 3D semiconductor memory device may include a substrate including a cell array region and a connection region. The 3D semiconductor memory device may include an electrode structure on a surface of the substrate. The electrode structure may extend in a first direction that is parallel to the surface of the substrate and may include a plurality of vertically stacked electrodes. An uppermost one of the plurality of vertically stacked electrodes may be a dummy electrode. The 3D semiconductor memory device may include first and second string selection electrodes that extend in the first direction on the electrode structure. The first and second string selection electrodes may be spaced apart from each other in a second direction that is parallel to the surface of the substrate and perpendicular to the first direction. The 3D semiconductor memory device may include an isolation insulating pattern between the first and second string selection electrodes. The isolation insulating pattern may penetrate the dummy electrode. The isolation insulating pattern may include a linear portion that extends in the first direction on the cell array region and a bending portion that extends from the linear portion on the connection region. The bending portion may be bent with respect to the linear portion. A length of the isolation insulating pattern in the first direction may be shorter than a length of the dummy electrode in the first direction and may be longer than lengths of the first and second string selection electrodes in the first direction.

According to some embodiments of the inventive concepts, three-dimensional (3D) semiconductor memory devices may be provided. A 3D semiconductor memory device may include a substrate including a cell array region and a connection region. The 3D semiconductor memory device may include an electrode structure including first and second electrodes that are vertically and alternately stacked on a surface of the substrate. The electrode structure may extend in a first direction that is parallel to the surface of the substrate and may include a stair step structure on the connection region. Ones of the first electrodes may include a first pad region on the connection region. The first pad region may be exposed by an adjacent second electrode. Ones of the second electrodes may include a second pad region on the connection region. The second pad region may be exposed by an adjacent first electrode. The second pad regions of the ones of the second electrodes may be adjacent, in a second direction that is parallel to the surface of the substrate and perpendicular to the first direction, to the first pad regions of respective ones of the first electrodes. An uppermost layer of the electrode structure may include an uppermost second electrode. A width of the second pad region of the uppermost second electrode may be greater than widths of the second pad regions of others of the second electrodes.

According to some embodiments of the inventive concepts, three-dimensional (3D) semiconductor memory devices may be provided. A 3D semiconductor memory device may include a substrate including a cell array region and a connection region. The 3D semiconductor memory device may include first and second electrode structures on a surface of the substrate that extend in a first direction that is parallel to the surface of the substrate. The first and second electrode structures spaced may be apart from each other in a second direction that is parallel to the surface of the substrate and perpendicular to the first direction. Each of the first and second electrode structures may include first electrodes and second electrodes that are vertically and alternately stacked on the substrate. The 3D semiconductor memory device may include a first pair of string selection electrodes that extent in the first direction on the first electrode structure. The 3D semiconductor memory device may include a second pair of string selection electrodes that extend in the first direction on the second electrode structure. The 3D semiconductor memory device may include a common source structure that extends in the first direction between the first and second electrode structures. Each of the string selection electrodes may include an electrode portion including a substantially uniform width and extending in the first direction on the cell array region, and a pad portion extending from the electrode portion in the first direction on the connection region and including a width that is different from the width of the electrode portion. The first pair of string selection electrodes and the second pair of string selection electrodes may be mirror-symmetric with respect to the common source structure.

According to some embodiments of the inventive concepts, three-dimensional (3D) semiconductor memory devices may be provided. A 3D semiconductor memory device may include a substrate including a cell array region and a connection region. The 3D semiconductor memory device may include a plurality of vertical channels in the cell array region. The 3D semiconductor memory device may include a plurality of first electrodes that are vertically stacked on a surface of the substrate in a first direction that is perpendicular to the surface of the substrate and that extend in a second direction that is perpendicular to the first direction from the cell array region to the connection region.

The 3D semiconductor memory device may include a plurality of second electrodes between the first electrodes in the first direction. The second electrodes may extend in the second direction from the cell array region to the connection region. Ones of the second electrodes may include a pad region on the connection region that is exposed by an adjacent first electrode that is further from the substrate.

The 3D semiconductor memory device may include a dummy electrode on an uppermost one of the first electrodes. The dummy electrode may extend in the second direction from the cell array region, to the connection region.

The 3D semiconductor memory device may include a first string selection electrode on the dummy electrode. The first string selection electrode may extend in the second direction from the cell array region to the connection region. The 3D semiconductor memory device may include a second string selection electrode on the first string selection electrode. The second string selection electrode may extend adjacent to the first string selection electrode in the second direction from the cell array region to the connection region.

The 3D semiconductor memory device may include an isolation insulating pattern separating the first and second string selection electrodes and penetrating the dummy electrode. The isolation insulating pattern may include a length in the second direction that is greater than lengths in the second direction of the first and second string selection electrodes and that is less than a length in the second direction of the dummy electrode. The isolation insulating pattern may extend from the cell array region to the connection region and may extend into the pad region of the dummy electrode.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1:
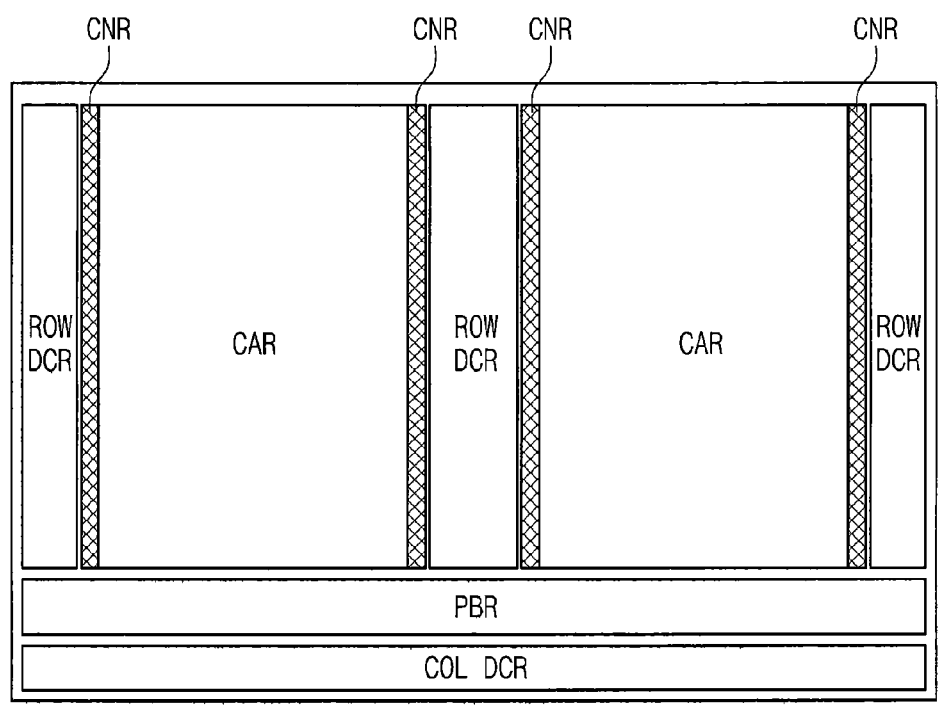
FIG. 1 is a schematic block diagram illustrating a portion of a 3D semiconductor memory device according to some embodiments of the inventive concepts.

Exemplary embodiments of aspects of the present inventive concepts explained and illustrated herein include their complementary counterparts. The same reference numerals or the same reference designators denote the same elements throughout the specification.

FIG. 1 is a schematic block diagram illustrating a portion of a 3D semiconductor memory device according to some embodiments of the inventive concepts.

Referring to FIG. 1, a 3D semiconductor memory device may include a cell array region CAR and a peripheral circuit region. The peripheral circuit region may include row decoder regions ROW DCR, a page buffer region PBR, a column decoder region COL DCR, and a control circuit region. In some embodiments, a connection region CNR may be disposed, for example, between the cell array region CAR and the row decoder region ROW DCR.

A memory cell array including a plurality of memory cells may be disposed in the cell array region CAR. In some embodiments, the memory cell array may include three-dimensionally arranged memory cells, word lines, and bit lines. The word lines and the bit lines may be electrically connected to the memory cells.

A row decoder for selecting the word lines of the memory cell array may be disposed in the row decoder region ROW DCR, and an interconnection structure may be disposed in the connection region CNR. The interconnection structure may include contact plugs and interconnections which electrically connect the memory cell array and the row decoder to each other. The row decoder may select one among the word lines of the memory cell array in response to an address signal. The row decoder may respectively provide a first word line voltage and second word line voltages to the selected word line and unselected word lines, respectively, in response to a control signal of a control circuit.

A page buffer for sensing data stored in the memory cells may be disposed in the page buffer region PBR. According to an operation mode, the page buffer may temporarily store data to be stored in the memory cells and/or may sense data stored in the memory cells. The page buffer may operate as a write driver circuit in a program operation mode and may operate as a sense amplifier circuit in a read operation mode.

A column decoder connected to the bit lines of the memory cell array may be disposed in the column decoder region COL DCR. The column decoder may provide a data transmission path between the page buffer and an external device (e.g., a memory controller).

Figure 2:
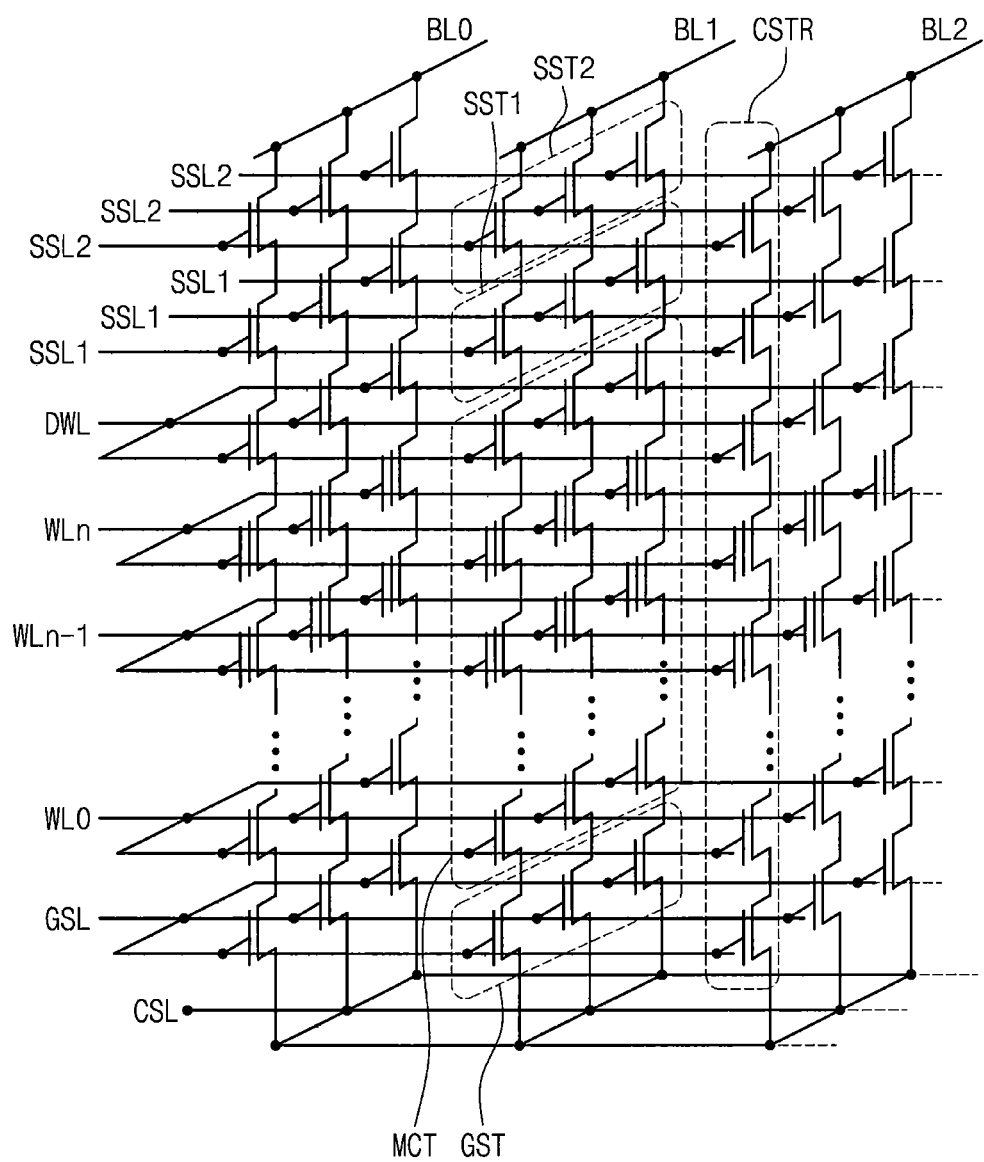
FIG. 2 is a schematic circuit diagram illustrating a portion of a 3D semiconductor memory device according to some embodiments of the inventive concepts.

FIG. 2 is a schematic circuit diagram illustrating a portion of a 3D semiconductor memory device according to some embodiments of the inventive concepts.

Referring to FIG. 2, a cell array of a 3D semiconductor memory device according to some embodiments may include a common source line CSL, a plurality of bit lines BL0 to BL2, and a plurality of cell strings CSTR connected between the common source line CSL and the bit lines BL0 to BL2.

The bit lines BL0 to BL2 may be two-dimensionally arranged and a plurality of the cell strings CSTR may be connected in parallel to each of the bit lines BL0 to BL2. The cell strings CSTR may be connected in common to the common source line CSL. In other words, a plurality of the cell strings CSTR may be disposed between one common source line CSL and a plurality of the bit lines BL0 to BL2. The common source line CSL may be provided in plurality, and the plurality of the common source lines CSL may be two-dimensionally arranged. In some embodiments, the same voltage may be applied to the plurality of the common source lines CSL. In some embodiments, the common source lines CSL may be electrically controlled independently of each other.

In some embodiments, each of the cell strings CSTR may include string selection transistors SST1 and SST2 connected in series to each other, memory cells MCT connected in series to each other, and a ground selection transistor GST. Each of the memory cells MCT may include a data storage element.

In some embodiments, each of the cell strings CSTR may include first and second string selection transistors SST1 and SST2 connected in series to each other. The second string selection transistor SST2 may be connected to one of the bit lines BL0 to BL2, and the ground selection transistor GST may be connected to the common source line CSL. The memory cells MCT may be connected in series between the first string selection transistor SST1 and the ground selection transistor GST.

In addition, each of the cell strings CSTR may further include a dummy cell connected between the first string selection transistor SST1 and the memory cell MCT. Even though not shown in the drawings, an additional dummy cell may be connected between the ground selection transistor GST and the memory cell MCT.

In some embodiments, in each of the cell strings CSTR, the ground selection transistor GST may consist of a plurality of MOS transistors connected in series to each other, like the string selection transistors SST1 and SST2. In some embodiments, each of the cell strings CSTR may include one string selection transistor.

The first string selection transistor SST1 may be controlled by a first string selection line SSL1, and the second string selection transistor SST2 may be controlled by a second string selection line SSL2. The memory cells MCT may be controlled by a plurality of word lines WL0 to WLn, and the dummy cell may be controlled by a dummy word line DWL. The ground selection transistor GST may be controlled by a ground selection line GSL. The common source line CSL may be connected in common to sources of the ground selection transistors GST.

A cell string CSTR may include a plurality of memory cells MCT located at different distances from the common source line CSL. Therefore, the word lines WL0 to WLn and DWL respectively located at different levels from each other may be disposed between the common source line CSL and the bit lines BL0 to BL2.

Gate electrodes of the memory cells MCT (or the dummy cells) that are disposed at the same level from the common source line CSL, may be connected in common to one of the word lines WL0 to WLn and DWL so as to be in an equipotential state. Alternatively, even though the gate electrodes of the memory cells MCT are disposed at the substantially same distance from the common source line CSL, the gate electrodes constituting one row (or one column) may be controlled independently of the gate electrodes constituting another row (or another column).

Figure 3:
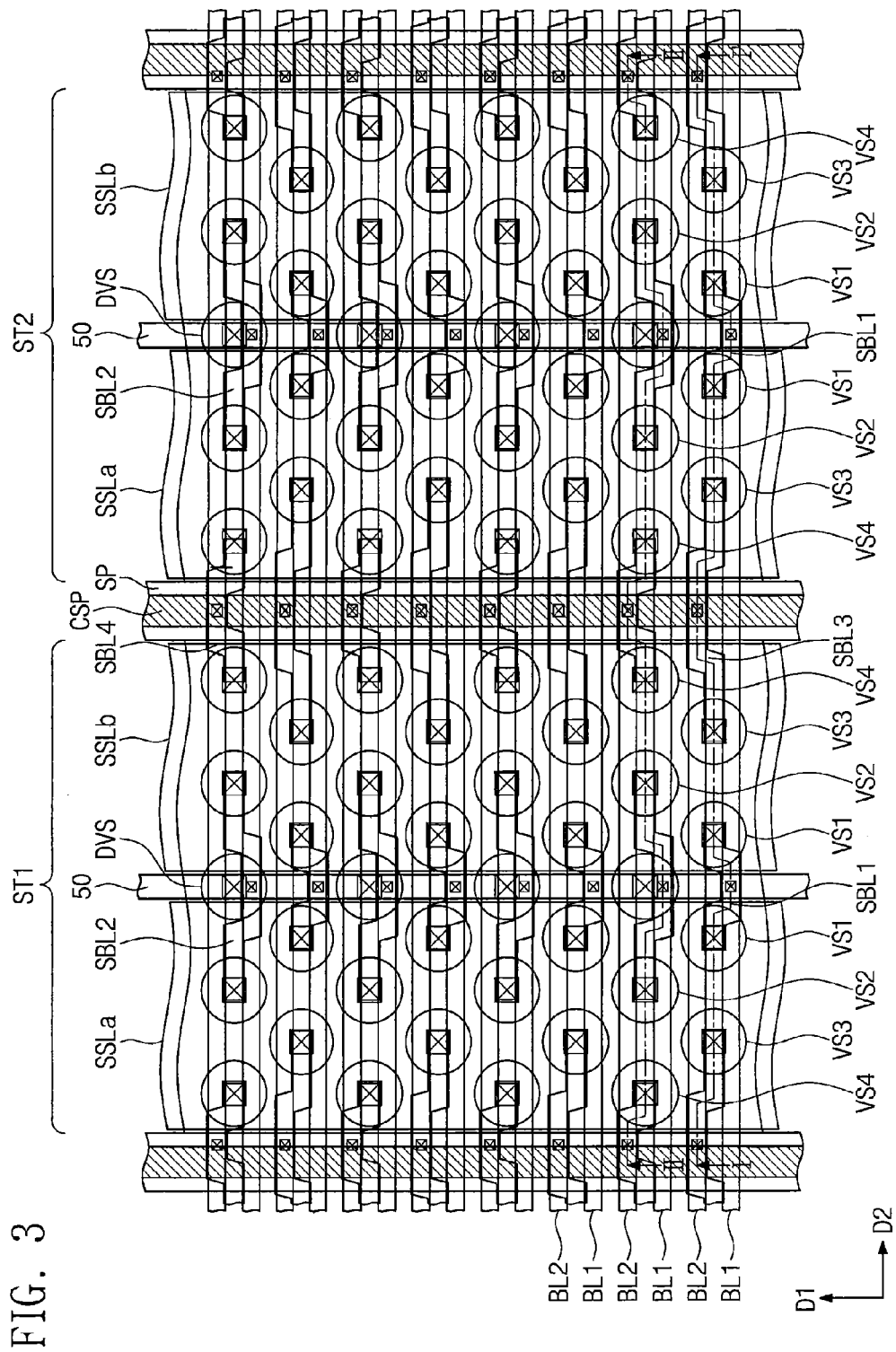
FIGS. 3 and 4 are plan views illustrating portions of 3D semiconductor memory devices according to some embodiments of the inventive concepts.
Figure 4:
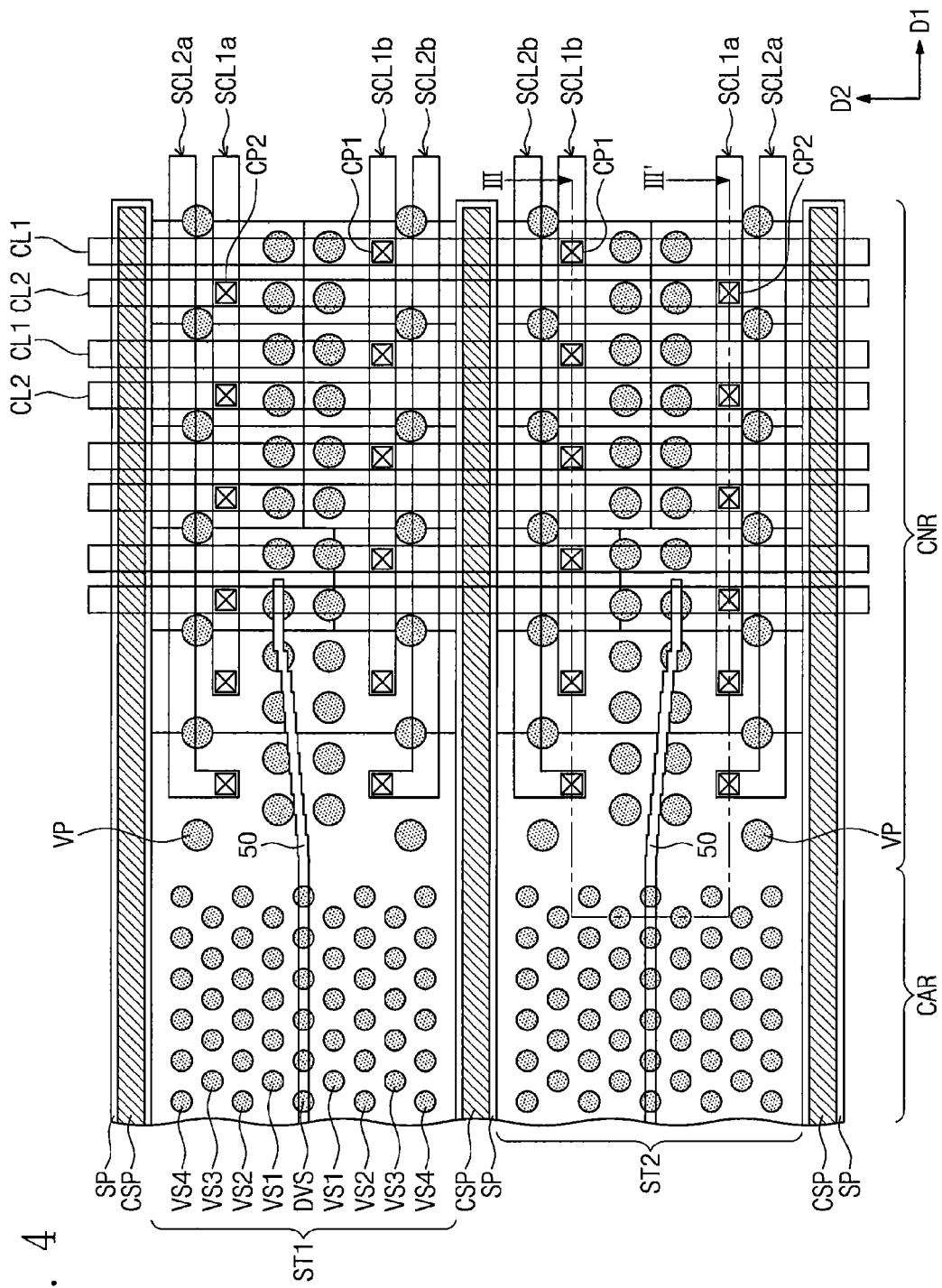
Figure 5:
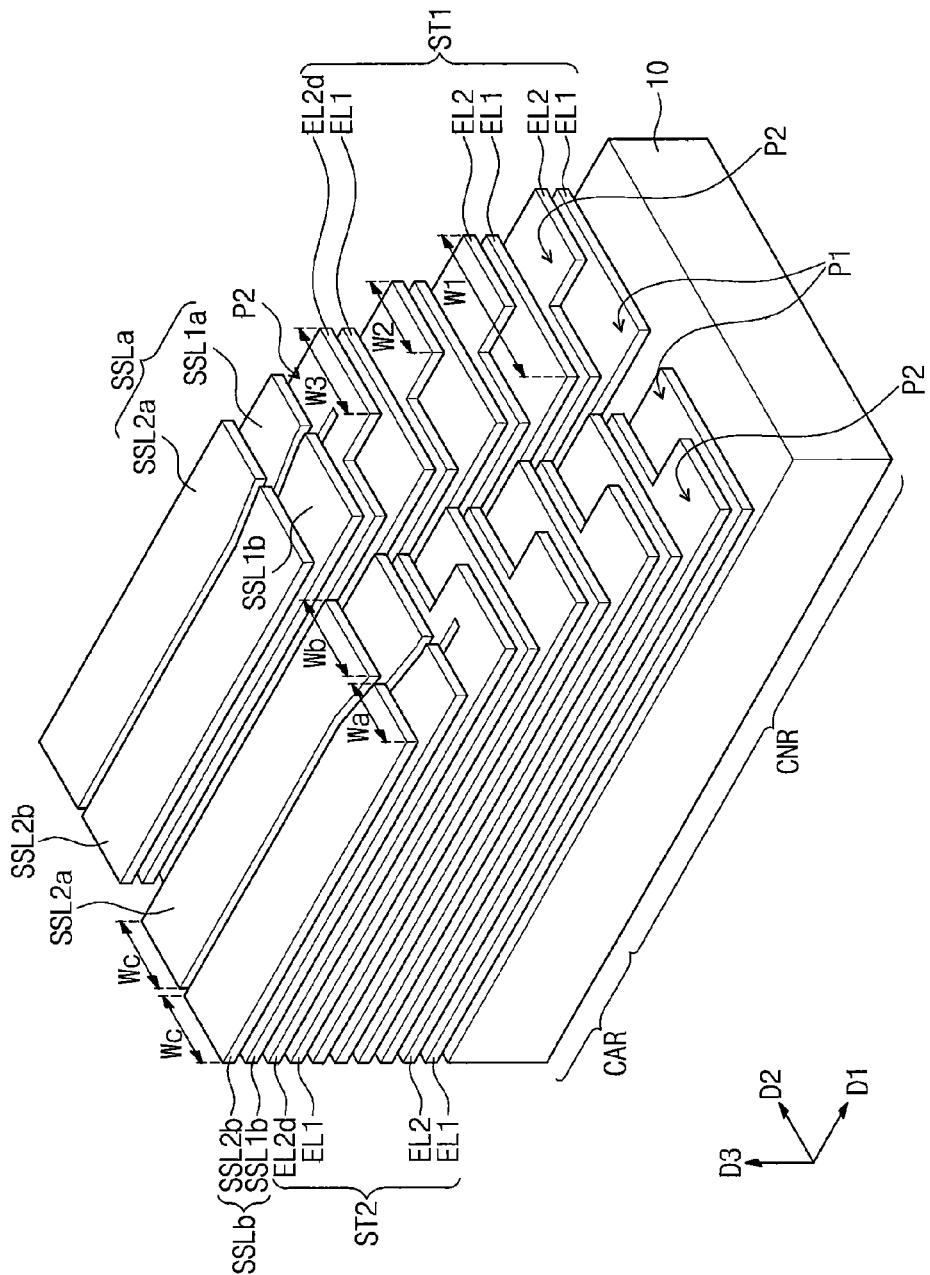
FIG. 5 is a perspective view illustrating a portion of an electrode structure of a 3D semiconductor memory device according to some embodiments of the inventive concepts.
Figure 6:
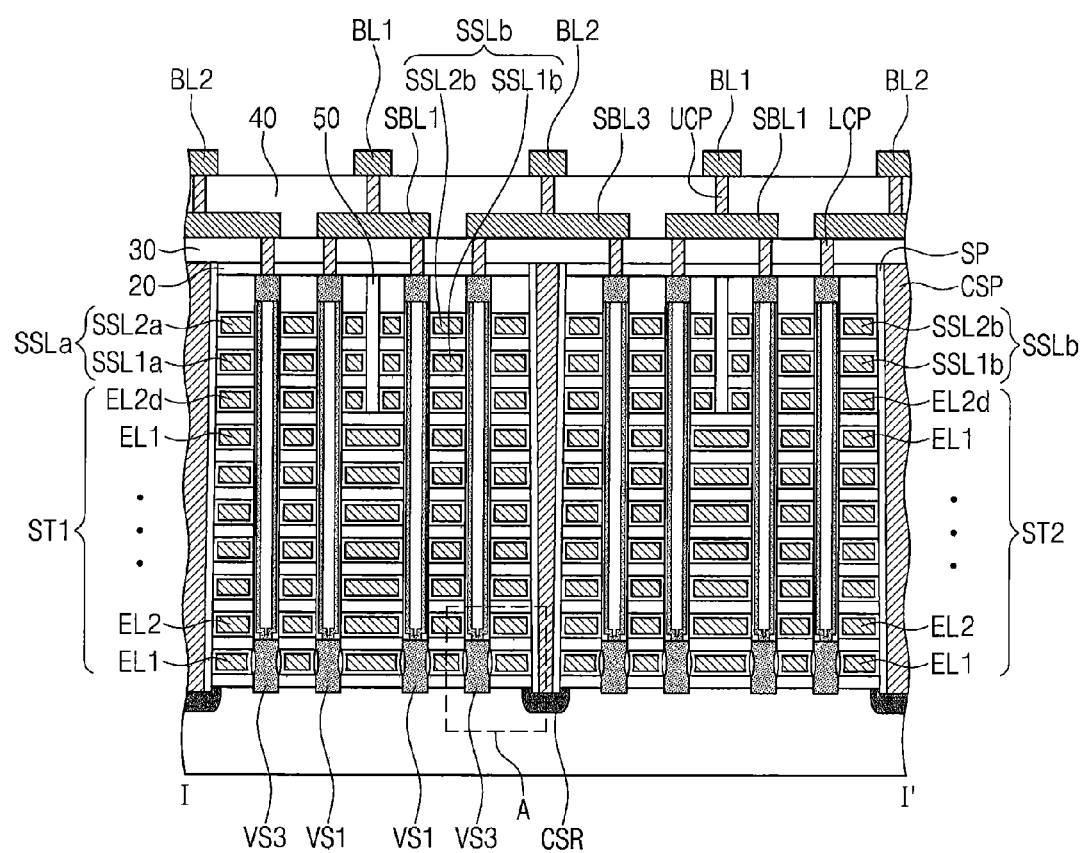
FIGS. 6 and 7 are cross-sectional views taken along lines I-I' and II-II' of FIG. 3, respectively, to illustrate portions of 3D semiconductor memory devices according to some embodiments of the inventive concepts.
Figure 7:
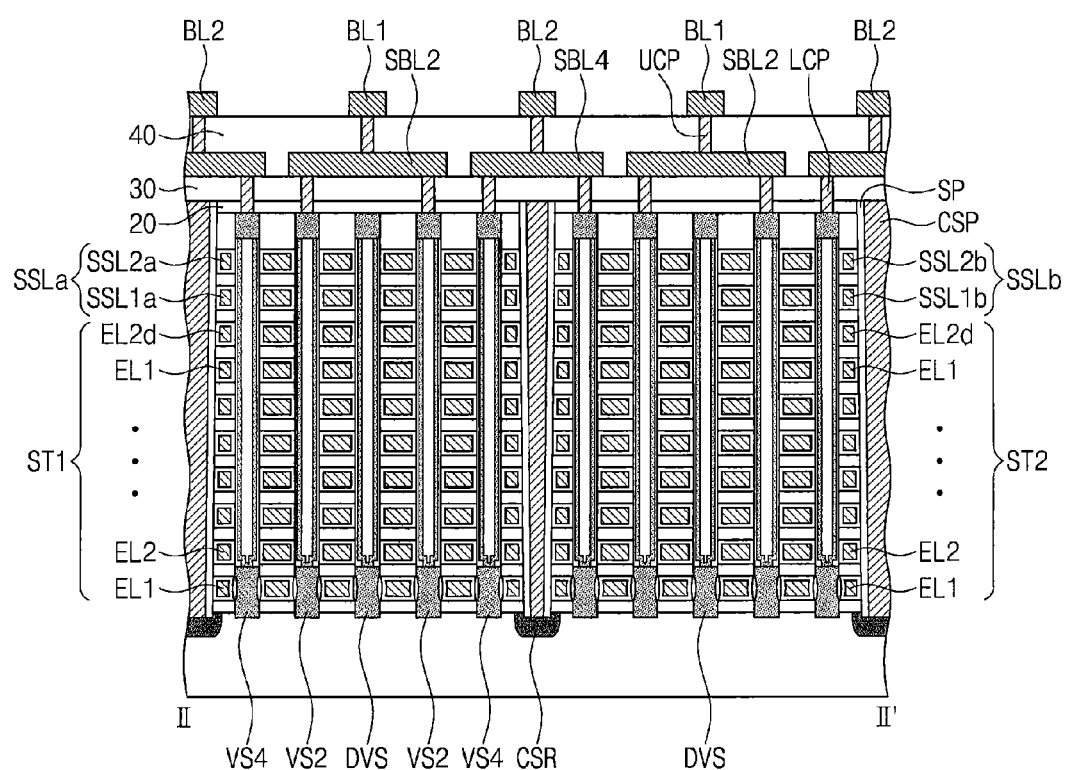
Figure 8:
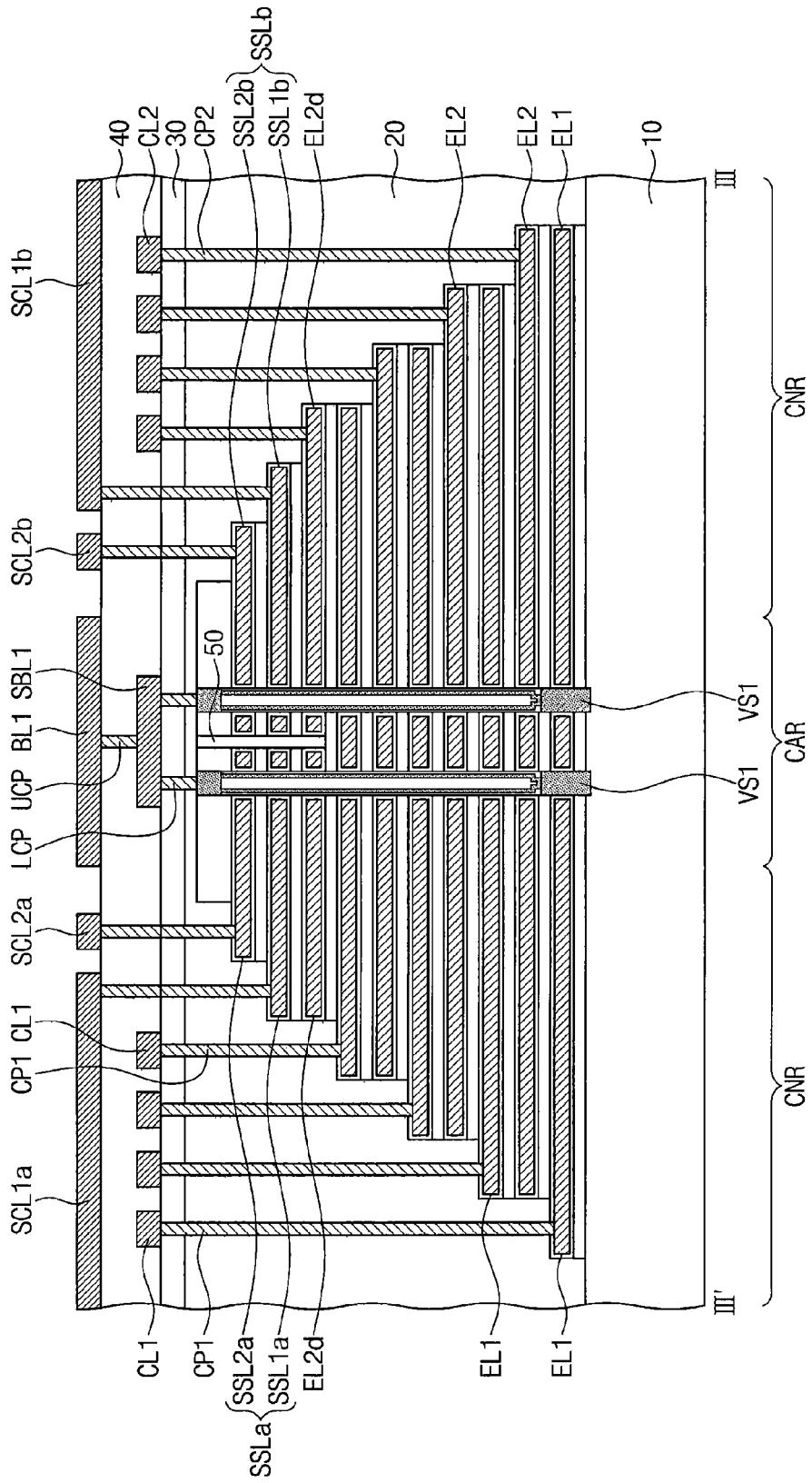
FIG. 8 is a cross-sectional view taken along a line III-III' of FIG. 4 to illustrate a portion of a 3D semiconductor memory device according to some embodiments of the inventive concepts.
Figure 9:
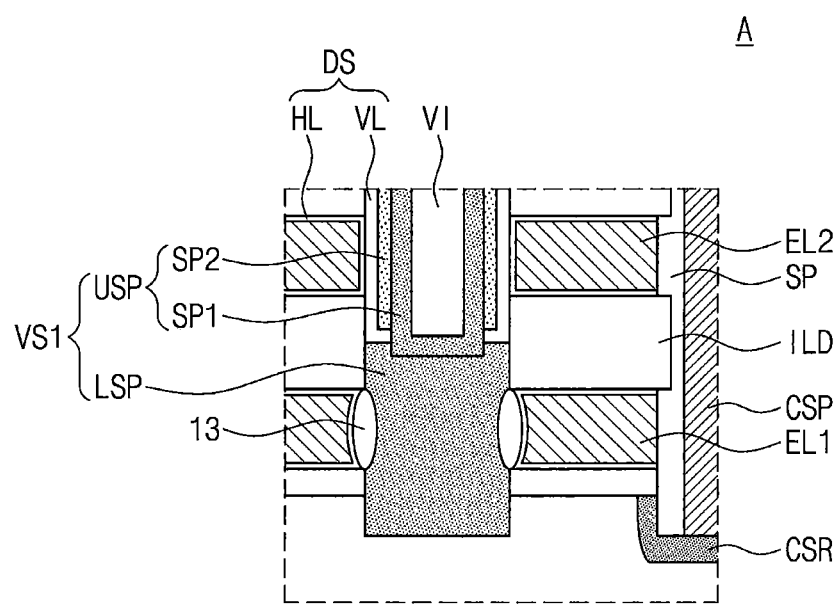
FIG. 9 is an enlarged view of a portion 'A' of FIG. 6.
Figure 10A:
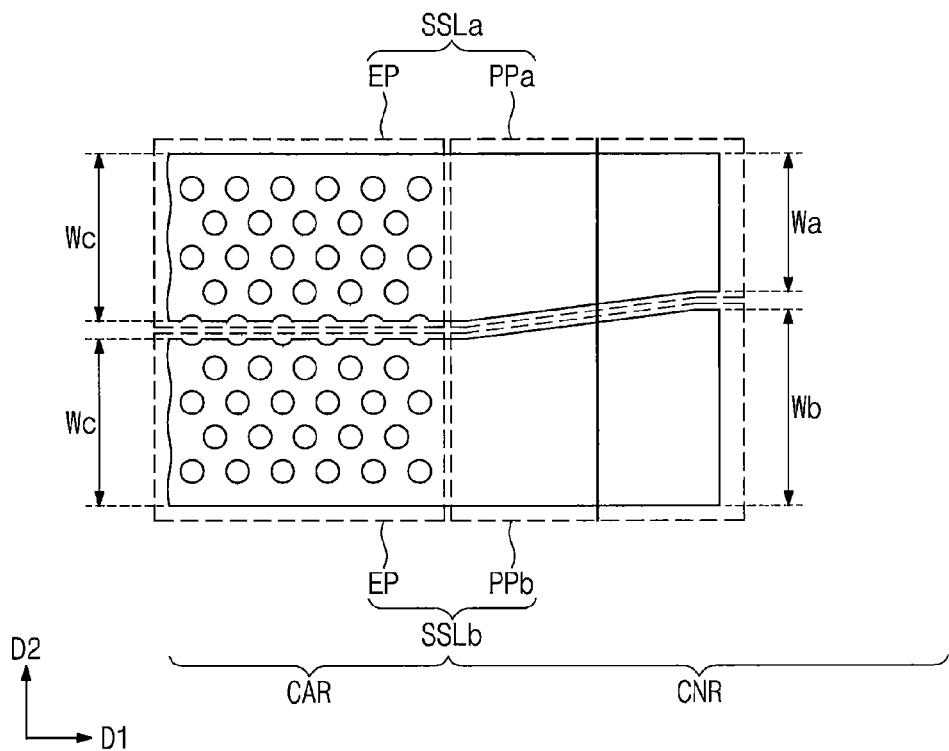
FIGS. 10A, 10B, and 10C are plan views illustrating electrodes included in electrode structures of 3D semiconductor memory devices according to some embodiments of the inventive concepts.
Figure 10B:
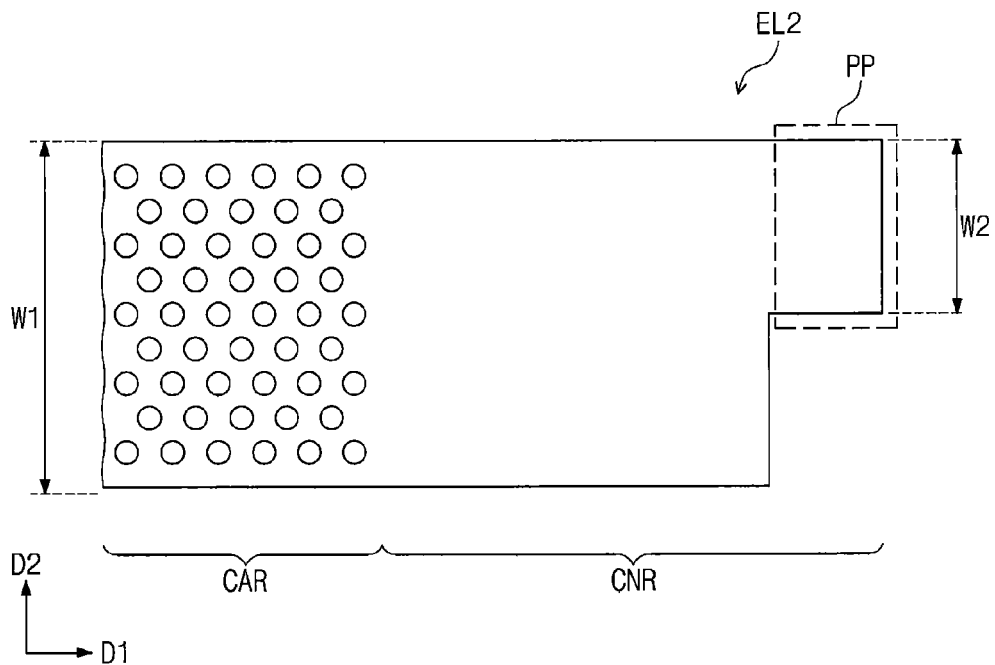
Figure 10C:
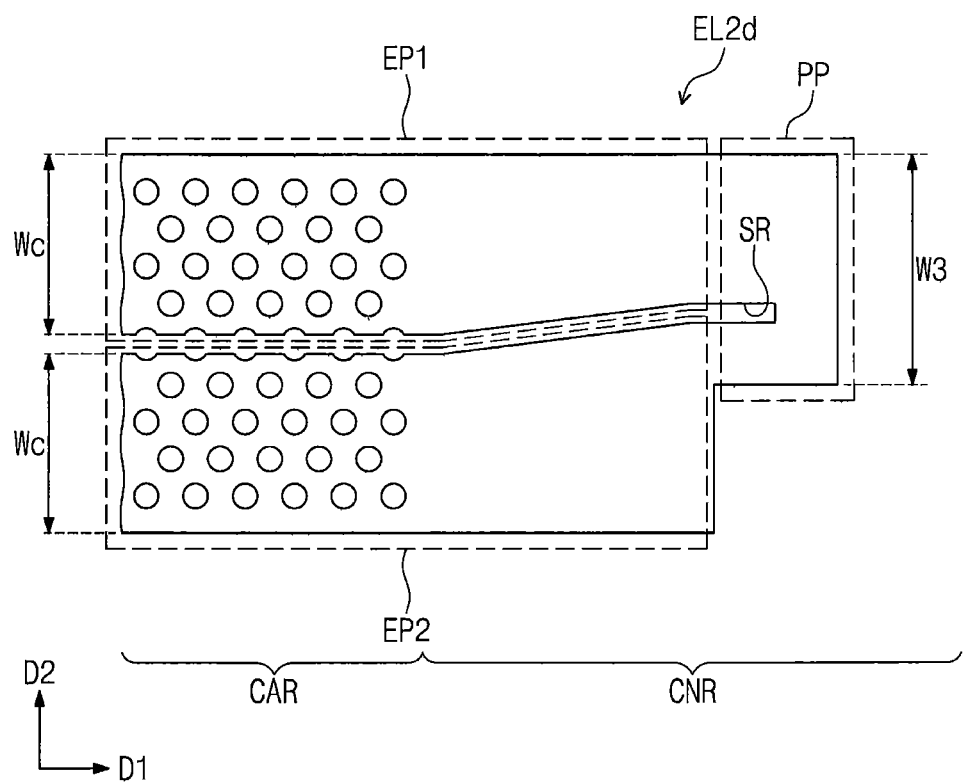
Figure 10D:
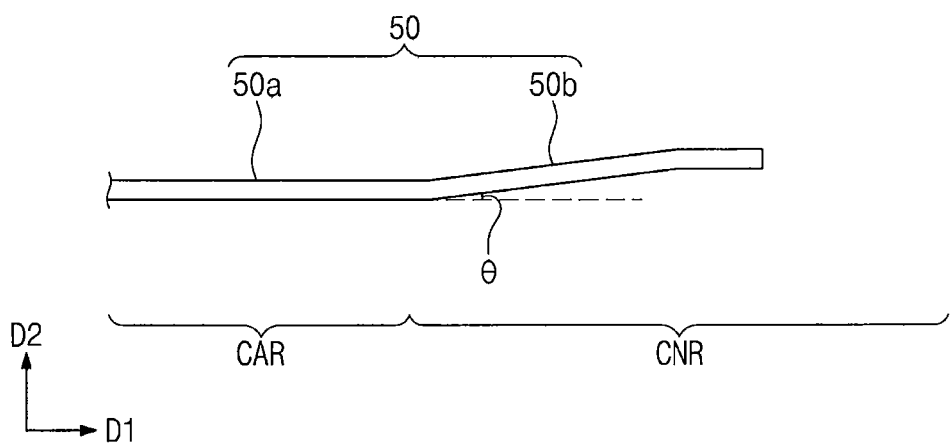
FIG. 10D is a plan view illustrating an isolation insulating pattern of a 3D semiconductor memory device according to some embodiments of the inventive concepts.

FIGS. 3 and 4 are plan views illustrating portions of 3D semiconductor memory devices according to some embodiments of the inventive concepts. FIG. 3 illustrates a cell array region of a 3D semiconductor memory device, and FIG. 4 illustrates a cell array region and a connection region of a 3D semiconductor memory device. FIG. 5 is a perspective view illustrating a portion of an electrode structure of a 3D semiconductor memory device according to some embodiments of the inventive concepts. FIGS. 6 and 7 are cross-sectional views taken along lines I-I' and II-II' of FIG. 3, respectively, to illustrate portions of 3D semiconductor memory devices according to some embodiments of the inventive concepts. FIG. 8 is a cross-sectional view taken along a line III-III' of FIG. 4 to illustrate a portion of a 3D semiconductor memory device according to some embodiments of the inventive concepts. FIG. 9 is an enlarged view of a portion 'A' of FIG. 6. FIGS. 10A, 10B, and 10C are plan views illustrating electrodes included in electrode structures of 3D semiconductor memory devices according to some embodiments of the inventive concepts. FIG. 10D is a plan view illustrating an isolation insulating pattern of a 3D semiconductor memory device according to some embodiments of the inventive concepts.

Referring to FIGS. 3 to 7, first and second electrode structures ST1 and ST2 may be disposed on a substrate 10. Each of the first and second electrode structures ST1 and ST2 may include a plurality of electrodes EL1 and EL2 which extend in a first direction D1 and are stacked along a third direction D3 perpendicular to a top surface of the substrate 10.

The substrate 10 may include a cell array region CAR and a connection region CNR and may include a semiconductor material. For example, the substrate 10 may include at least one of silicon (Si), germanium (Ge), silicon-germanium (SiGe), gallium-arsenic (GaAs), indium-gallium-arsenic (InGaAs), and/or aluminum-gallium-arsenic (AlGaAs). The substrate 10 may be a bulk silicon substrate, a silicon-on-insulator (SOI) substrate, a germanium substrate, a germanium-on-insulator (GOI) substrate, a silicon-germanium substrate, and/or a substrate having an epitaxial thin layer obtained by performing a selective epitaxial growth (SEG) process. In some embodiments, the substrate 10 may include an insulating material and may include a single layer or a plurality of thin layers. For example, the substrate 10 may include at least one of a silicon oxide layer, a silicon nitride layer, and/or a low-k dielectric layer.

As illustrated in FIGS. 3, 4, and 5, the first and second electrode structures ST1 and ST2 may extend in the first direction D1 so as to be disposed on the cell array region CAR and the connection region CNR and may be spaced apart from each other in a second direction D2. In some embodiments, each of the first and second electrode structures ST1 and ST2 may include first electrodes EL1 and second electrodes EL2 which are alternately stacked on the substrate 10 in the third direction D3. The first and second electrodes EL1 and EL2 may include a conductive material. For example, the electrodes EL1 and EL2 may include at least one of a doped semiconductor material (e.g., doped silicon), a metal (e.g., tungsten, copper, and/or aluminum), a conductive metal nitride (e.g., titanium nitride and/or tantalum nitride), and/or a transition metal (e.g., titanium and/or tantalum). In addition, each of the first and second electrode structures ST1 and ST2 may further include insulating layers disposed between the first and second electrodes EL1 and EL2.

Each of the first and second electrode structures ST1 and ST2 may have first and second sidewalls opposite to each other. The first and second sidewalls may be substantially perpendicular to the top surface of the substrate 10.

Each of the first and second electrode structures ST1 and ST2 may have a stair step structure on the connection region CNR. In other words, on the connection region CNR, a height of each of the first and second electrode structures ST1 and ST2 may decrease as a distance from the cell array region CAR increases.

Referring to FIG. 5, in each of the first and second electrode structures ST1 and ST2, each of the first electrodes EL1 may have a first pad region P1 exposed by the second electrode EL2 disposed immediately on each of the first electrodes EL1, and each of the second electrodes EL2 may have a second pad region P2 exposed by the first electrode EL1 disposed immediately on each of the second electrodes EL2. The first and second pad regions P1 and P2 may be disposed on the connection region CNR. In each of the first and second electrode structures ST1 and ST2, the first pad regions P1 of the first electrodes EL1 may be arranged along the first direction D1 in a plan view and the second pad regions P2 of the second electrodes EL2 may also be arranged along the first direction D1 in a plan view. In other words, in each of the first and second electrode structures ST1 and ST2, the first pad regions P1 of the first electrodes EL1 may be disposed at positions horizontally and vertically different from each other. Likewise, in each of the first and second electrode structures ST1 and ST2, the second pad regions P2 of the second electrodes EL2 may also be disposed at positions horizontally and vertically different from each other. The first pad regions P1 of the first electrodes EL1 may be adjacent to the second pad regions P2 of the second electrodes EL2 in the second direction D2 when viewed from a plan view.

Each of the first and second electrode structures ST1 and ST2 may have a first stair step structure formed by the first pad regions P1 of the first electrodes EL1 exposed on the connection region CNR, and a second stair step structure formed by the second pad regions P2 of the second electrodes EL2 exposed on the connection region CNR. In detail, the first stair step structure formed by the first pad regions P1 of the first electrodes EL1 may have a staircase shape downward along the first direction D1. Likewise, the second stair step structure formed by the second pad regions P2 of the second electrodes EL2 may also have a staircase shape downward along the first direction D1. The second stair step structure may be adjacent to the first stair step structure in the second direction D2 in each of the first and second electrode structures ST1 and ST2.

In addition, the first and second electrode structures ST1 and ST2 may be disposed on the substrate 10 in such a way that the first stair step structure of the first electrode structure ST1 is adjacent to the first stair step structure of the second electrode structure ST2 in the second direction D2. In other words, the first pad regions P1 of the first electrode structure ST1 may be adjacent to the first pad regions P1 of the second electrode structure ST2. That is, the first and second electrode structures ST1 and ST2 adjacent to each other in the second direction D2 may be mirror-symmetric with respect to an imaginary line parallel to the first direction D1.

In some embodiments, in each of the first and second electrode structures ST1 and ST2, the second electrode EL2 corresponding to the uppermost layer may be the dummy word line connected to the dummy memory cells described with reference to FIG. 2. Hereinafter, the second electrode EL2 corresponding to the uppermost layer may be referred to as a dummy electrode EL2d. The first electrode EL corresponding to the lowermost layer in each of the first and second electrode structures ST1 and ST2 may be the ground selection line GSL connected to the ground selection transistors GST described with reference to FIG. 2. The first and second electrodes EL1 and EL2 between the uppermost dummy electrode EL2d and the lowermost first electrode may be the word lines WL0 to WLn connected to the memory cells MCT described with reference to FIG. 2.

In some embodiments, first and second string selection electrodes SSLa and SSLb may be disposed on each of the first and second electrode structures ST1 and ST2. In some embodiments, the first string selection electrode SSLa may include first lower and upper string selection electrodes SSL1a and SSL2a stacked on each of the electrode structures ST1 and ST2, and the second string selection electrode SSLb may include second lower and upper string selection electrodes SSL1b and SSL2b stacked on each of the electrode structures ST1 and ST2.

The first and second string selection electrodes SSLa and SSLb may extend in the first direction D1 on each of the electrode structures ST1 and ST2 and may be spaced apart from each other in the second direction D2 on each of the electrode structures ST1 and ST2. In other words, the first and second string selection electrodes SSLa and SSLb may be disposed at the same distance from the substrate 10 and may be laterally spaced apart from each other.

In addition, in the first direction D1, the first and second string selection electrodes SSLa and SSLb may be shorter than the electrode structures ST1 and ST2. In other words, lengths of the first and second string selection electrodes SSLa and SSLb in the first direction D1 may be less than the minimum length of each of the electrode structures ST1 and ST2 in the first direction D1 (i.e., a length of the dummy electrode EL2d in the first direction D1). Thus, the first and second string selection electrodes SSLa and SSLb may expose the first and second pad regions P1 and P2 of the first and second electrode structures ST1 and ST2 on the connection region CNR. In addition, the first and second upper string selection electrodes SSL2a and SSL2b may expose end portions of the first and second lower string selection electrodes SSL1a and SSL1b on the connection region CNR.

In some embodiments, the first string selection electrode SSLa may have one sidewall aligned with the first sidewall of each of the first and second electrode structures ST1 and ST2, and the second string selection electrode SSLb may have one sidewall aligned with the second sidewall of each of the first and second electrode structures ST1 and ST2. On the cell array region CAR, each of the first and second string selection electrodes SSLa and SSLb may have a width Wc smaller than a half of a width W1 of each of the first and second electrode structures ST1 and ST2.

In some embodiments, the first and second lower string selection electrodes SSL1a and SSL1b and the first and second upper string selection electrodes SSL2a and SSL2b may be the first and second string selection lines SSL1 and SSL2 connected to the first and second string selection transistors SST1 and SST2 described with reference to FIG. 2.

In some embodiments, an isolation insulating pattern 50 may be disposed between the first and second string selection electrodes SSLa and SSLb in each of the first and second electrode structures ST1 and ST2. The isolation insulating pattern 50 may extend from the cell array region CAR onto the connection region CNR along the first direction D1. A length of the isolation insulating pattern 50 in the first direction D1 may be less than the length of the dummy electrode EL2d in the first direction D1 and may be greater than the lengths of the first and second string selection electrodes SSLa and SSLb in the first direction D1. In addition, the isolation insulating pattern 50 may vertically extend to penetrate the dummy electrode EL2d. In some embodiments, an end portion of the isolation insulating pattern 50 may be spaced apart from the first pad region P1 of the first electrode EL1 disposed under the dummy electrode EL2d when viewed from a plan view.

In some embodiments, the isolation insulating pattern 50 may include a linear portion 50a extending in the first direction D1 on the cell array region CAR and a bending portion 50b extending from the linear portion 50a so as to be disposed on the connection region CNR, as illustrated in FIG. 10D. The bending portion 50b may be bent at a specific angle θ with respect to an imaginary line parallel to the first direction D1 when viewed from a plan view. In some embodiments, the isolation insulating pattern 50 may have a substantially uniform width and may extend from the cell array region CAR onto the connection region CNR. In other words, a width of the linear portion 50a of the isolation insulating pattern 50 may be substantially equal to a width of the bending portion 50b of the isolation insulating pattern 50.

The bending portion 50b of the isolation insulating pattern 50 of the first electrode structure ST1 and the bending portion 50b of the isolation insulating pattern 50 of the second electrode structure ST2 may be bent in directions opposite to each other, as illustrated in FIG. 4. In other words, the isolation insulating patterns 50 of the first and second electrode structures ST1 and ST2 may be mirror-symmetric with respect to the imaginary line parallel to the first direction D1.

In more detail, referring to FIGS. 5 and 10A, each of the first and second string selection electrodes SSLa and SSLb may include an electrode portion EP disposed on the cell array region CAR and a pad portion PPa or PPb extending from the electrode portion EP so as to be disposed on the connection region CNR. In each of the first and second string selection electrodes SSLa and SSLb, a width Wa or Wb of the pad portion PPa or PPb may be different from a width Wc of the electrode portion EP. In addition, the pad portion PPa of the first string selection electrode SSLa may have a first width Wa, and the pad portion PPb of the second string selection electrode SSLb may have a second width Wb different from the first width Wa. For example, the first width Wa of the pad portion PPa of the first string selection electrode SSLa may be smaller than the width Wc of the electrode portion EP of the first string selection electrode SSLa, and the second width Wb of the pad portion PPb of the second string selection electrode SSLb may be greater than the width Wc of the electrode portion EP of the second string selection electrode SSLb.

In addition, in the first string selection electrode SSLa disposed on the first electrode structure ST1, a width of the pad portion PPa may gradually decrease as a distance from the electrode portion EP increases. In the second string selection electrode SSLb disposed on the first electrode structure ST1, a width of the pad portion PPb may gradually increase as a distance from the electrode portion EP increases. Furthermore, a distance between the electrode portions EP of the first and second string selection electrodes SSLa and SSLb may be substantially equal to a distance between the pad portions PPa and PPb of the first and second string selection electrodes SSLa and SSLb.

Referring to FIG. 5, in each of the first and second electrode structures ST1 and ST2, each of the first electrodes EL1 may have a linear shape that extends from the cell array region CAR onto the connection region CNR and has a uniform width W1. Lengths of the first electrodes EL1 in the first direction D1 may sequentially decrease as a vertical distance from the substrate 10 increases.

Referring to FIGS. 5 and 10B, each of the second electrodes EL2 may extend from the cell array region CAR onto the connection region CNR. Each of the second electrodes EL2 may include an electrode portion having a uniform width W1 on the cell array region CAR and a protrusion PP extending from the electrode portion. The protrusion PP may have a width W2 smaller than the width W1 of the electrode portion of the second electrode EL2. The width W1 of the electrode portion of the second electrode EL2 may be substantially equal to the width W1 of the first electrode EL1. The protrusion PP may correspond to the second pad region P2.

In each of the electrode structures ST1 and ST2, lengths of the second electrodes EL2 in the first direction D1 may sequentially decrease as a vertical distance from the substrate 10 increases. Thus, as illustrated in FIG. 5, each of the second electrodes EL2 may vertically overlap with the first electrode EL1 disposed thereunder, except the first pad region P1 of the first electrode EL1. The protrusion PP of the second electrode EL2 may have a sidewall aligned with one sidewall of the first electrode EL1 disposed thereunder. In addition, the protrusion PP of each of the second electrodes EL2 may be exposed by the first electrode EL1 disposed on each of the second electrodes EL2.

In each of the first and second electrode structures ST1 and ST2, the first pad regions P1 may correspond to portions of the first electrodes EL1 exposed by the second electrodes EL2 and may be vertically and horizontally spaced apart from each other. In addition, in each of the first and second electrode structures ST1 and ST2, the second pad regions P2 may correspond to the protrusions PP of the second electrodes EL2 and may vertically and horizontally spaced apart from each other.

Referring to FIGS. 5 and 10C, the second electrode (i.e., the dummy electrode EL2d) corresponding to the uppermost layer in each of the electrode structures ST1 and ST2 may include a protrusion PP on the connection region CNR. The protrusion PP of the dummy electrode EL2d may have a width W3 greater than the widths W2 of the protrusions PP of the second electrodes EL2 disposed under the dummy electrode EL2d. Thus, in each of the electrode structures ST1 and ST2, the width W3 of the uppermost one of the second pad regions P2 may be greater than the widths W2 of others of the second pad regions P2. In addition, in each of the electrode structures ST1 and ST2, a width of the first pad region P1 of the uppermost one of the first electrodes EL1 may be smaller than widths of the first pad regions P1 of others of the first electrodes EL1.

In detail, as illustrated in FIG. 10C, the dummy electrode EL2d may include first and second electrode portions EP1 and EP2 horizontally spaced apart from each other on the cell array region CAR, and the protrusion PP horizontally connecting the first and second electrode portions EP1 and EP2 to each other on the connection region CNR.

Widths Wc of the first and second electrode portions EP1 and EP2 of the dummy electrode EL2d may be substantially equal to each other on the cell array region CAR. In some embodiments, the width Wc of the first electrode portion EP1 may be substantially equal to the width of the first string selection electrode SSLa disposed on the first electrode portion EP1, and the width Wc of the second electrode portion EP2 may be substantially equal to the width of the second string selection electrode SSLb disposed on the second electrode portion EP2. In addition, a distance between the first and second electrode portions EP1 and EP2 of the dummy electrode EL2d may be substantially uniform. On the connection region CNR, a width of the first electrode portion EP1 may decrease as a distance from the protrusion PP decreases. On the contrary, on the connection region CNR, a width of the second electrode portion EP2 may increase as a distance from the protrusion PP decreases.

Furthermore, the dummy electrode EL2d may have an isolation region SR between the first and second electrode portions EP1 and EP2. The isolation region SR of the dummy electrode EL2d may extend into a portion of the protrusion PP of the dummy electrode EL2d and may be bent on the connection region CNR at a specific angle with respect to an imaginary line parallel to the first direction D1 when viewed from a plan view. A length of the isolation region SR in the first direction D1 may be less than the maximum length of the dummy electrode EL2d in the first direction D1. Thus, it is possible to prevent the first and second electrode portions EP1 and EP2 of the dummy electrode EL2d from being electrically isolated from each other. As a result, the first and second electrode portions EP1 and EP2 of the dummy electrode EL2d may be in an equipotential state.

In some embodiments, the isolation region SR of the dummy electrode EL2d may be filled with the isolation insulating pattern 50. Thus, the isolation insulating pattern 50 may extend from between the first and second electrode portions EP1 and EP2 of the cell array region CAR into a portion of the protrusion PP of the dummy electrode EL2d.

In addition, the protrusion PP of the dummy electrode EL2d may expose a portion (i.e., the first pad region P1) of the first electrode EL1 disposed under the dummy electrode EL2d. The protrusion PP of the dummy electrode EL2d may have a sidewall aligned with one sidewall of the first electrode EL1 disposed under the dummy electrode EL2d.

In some embodiments, as illustrated in FIGS. 3 and 5, the first string selection electrode SSLa disposed on the dummy electrode EL2d may overlap with the first electrode portion EP1 of the dummy electrode EL2d when viewed from a plan view. In addition, the second string selection electrode SSLb on the dummy electrode EL2d may overlap with the second electrode portion EP2 of the dummy electrode EL2d when viewed from a plan view.

Referring again to FIGS. 3, 6, 7, and 8, first to fourth vertical channels VS1, VS2, VS3, and VS4 may penetrate the first and second electrode structures ST1 and ST2 on the cell array region CAR. The first to fourth vertical channels VS1 to VS4 may be coupled to each of the first and second string selection electrodes SSLa and SSLb in each of the first and second electrode structures ST1 and ST2. In other words, the first to fourth vertical channels VS1 to VS4 may penetrate each of the first and second string selection electrodes SSLa and SSLb.

Referring to FIG. 3, the first vertical channels VS1 may be arranged in the first direction D1 to constitute a first column, and the second vertical channels VS2 may be arranged in the first direction D1 to constitute a second column. The third vertical channels VS3 may be arranged in the first direction D1 to constitute a third column, and the fourth vertical channels VS4 may be arranged in the first direction D1 to constitute a fourth column. The first to fourth columns may be arranged along the second direction D2. The first and third vertical channels VS1 and VS3 may be respectively spaced apart from the second and fourth vertical channels VS2 and VS4 in a diagonal direction.

The first to fourth vertical channels VS1 to VS4 penetrating the first string selection electrode SSLa and the first to fourth vertical channels VS1 to VS4 penetrating the second string selection electrode SSLb may be mirror-symmetrically arranged with respect to the isolation insulating pattern 50 when viewed from a plan view.

In addition, dummy vertical channels DVS may penetrate the first and second electrode structures ST1 and ST2 on the cell array region CAR. In each of the first and second electrode structures ST1 and ST2, the dummy vertical channels DVS may be spaced apart from each other and may be arranged in the first direction D1. The dummy vertical channels DVS may be disposed between the first and second string selection electrodes SSLa and SSLb of each of the electrode structures ST1 and ST2. In addition, the dummy vertical channels DVS may penetrate the isolation insulating pattern 50 on the cell array region CAR. Each of the dummy vertical channels DVS may be disposed between the second vertical channels VS2 adjacent to each other in the second direction D2 and may be spaced apart from respective ones of the first vertical channels VS1 in diagonal directions.

In some embodiments, the first to fourth vertical channels VS1 to VS4 and the dummy vertical channels DVS may include the substantially same materials as each other and may have the substantially same structures as each other. For example, the vertical channels VS1 to VS4 and DVS may have, for example, a hollow pipe shape or a hollow macaroni shape. Alternatively, the vertical channels VS1 to VS4 and DVS may have a pillar shape having a circular horizontal cross section.

The vertical channels VS1 to VS4 may include a semiconductor material and/or a conductive material. In some embodiments, bottom surfaces of the vertical channels VS1 to VS4 may be disposed at a level between the top surface and a bottom surface of the substrate 10. A contact pad may be disposed on a top end of the vertical channels VS1 to VS4.

In some embodiments, the vertical channels VS1 to VS4 and DVS may include a lower semiconductor pattern LSP and an upper semiconductor pattern USP, as illustrated in FIG. 9. In some embodiments, the lower and upper semiconductor patterns LSP and USP may include silicon (Si), germanium (Ge), or a mixture thereof and may have crystal structures different from each other. The lower and upper semiconductor patterns LSP and USP may have a crystal structure including at least one of a single-crystalline structure, an amorphous structure, and/or a poly-crystalline structure. The lower and upper semiconductor patterns LSP and USP may be undoped or may be doped with dopants having the same conductivity type as dopants of the substrate 10.

The lower semiconductor pattern LSP may be in direct contact with the substrate 10 and may penetrate the lowermost electrode of the electrode structure ST1 and/or ST2. The upper semiconductor pattern USP may include a first semiconductor pattern SP1 and a second semiconductor pattern SP2. The first semiconductor pattern SP1 may be connected to the lower semiconductor pattern LSP and may have a pipe or macaroni shape having a closed bottom end. The inside of the first semiconductor pattern SP1 may be filled with a filling insulation pattern VI. The first semiconductor pattern SP1 may be in contact with an inner sidewall of the second semiconductor pattern SP2 and a top surface of the lower semiconductor pattern LSP. In other words, the first semiconductor pattern SP1 may electrically connect the second semiconductor pattern SP2 to the lower semiconductor pattern LSP. The second semiconductor pattern SP2 may have a pipe or macaroni shape of which top and bottom ends are opened. The second semiconductor pattern SP2 may not be in contact with the lower semiconductor pattern LSP but may be spaced apart from the lower semiconductor pattern LSP.

In some embodiments, a data storage layer DS may be disposed between the electrode structures ST1 and ST2 and the vertical channels VS1 to VS4 and DVS. The data storage layer DS may include a vertical insulating layer VL penetrating the electrode structures ST1 and ST2, and a horizontal insulating layer HL extending from between the vertical insulating layer VL and the electrodes EL1 and EL2 onto top and bottom surfaces of each of the electrodes EL1 and EL2.

In some embodiments, the 3D semiconductor memory device may be an NAND flash memory device. For example, the data storage layer DS disposed between the electrode structures ST1 and ST2 and the vertical channels VS1 to VS4 and DVS may include a tunnel insulating layer, a charge storage layer, and a blocking insulating layer. Data stored in the data storage layer DS may be changed, for example, using the Fowler-Nordheim tunneling induced by a difference in voltage between the vertical channels VS1 to VS4 and the electrodes EL1 and EL2 of the electrode structures ST1 and ST2.

In some embodiments, a common source region CSR may be provided in the substrate 10 between the first and second electrode structures ST1 and ST2. In addition, common source regions CSR may also be provided in the substrate 10 at both sides of the first and second electrode structures ST1 and ST2. The common source regions CSR may extend along the first direction D1 in parallel to the first and second electrode structures ST1 and ST2. The common source regions CSR may be formed by doping portions of the substrate 10 with dopants. A conductivity type of the common source regions CSR may be different from that of the substrate 10. For example, the common source regions CSR may include N-type dopants (e.g., arsenic (As) and/or phosphorus (P)).

A common source plug CSP may be connected to each of the common source regions CSR, and a sidewall insulating spacer SP may be disposed between the common source plug CSP and the first and second electrode structures ST1 and ST2. In some embodiments, the common source plug CSP may have a substantially uniform upper width in the second direction D2 and may extend in the first direction D1. The sidewall insulating spacers SP may be disposed oppositely to each other between the first and second electrode structures ST1 and ST2 adjacent to each other. In some embodiments, the sidewall insulating spacer SP may fill a space between the first and second electrode structures ST1 and ST2, and the common source plug CSP may penetrate the sidewall insulating spacer SP so as to be connected to a portion of the common source region CSR.

A filling insulation layer 20 and a capping insulating layer 30 may cover the electrode structures ST1 and ST2. First, second, third, and fourth assistant interconnections SBL1, SBL2, SBL3, and SBL4 may be disposed on the capping insulating layer 30.

In some embodiments, the first assistant interconnections SBL1 may be electrically connected through lower contact plugs LCP to first vertical channels VS1 that are adjacent to each other in the second direction D2. The second assistant interconnections SBL2 may be electrically connected through lower contact plugs LCP to the second vertical channels VS2 that are adjacent to each other in the second direction D2. In some embodiments, lengths of the first assistant interconnections SBL1 may be shorter than lengths of the second assistant interconnections SBL2.

In some embodiments, the third assistant interconnections SBL3 may be electrically connected through lower contact plugs LCP to the third vertical channels VS3 that are adjacent to each other in the second direction D2. The fourth assistant interconnections SBL4 may be electrically connected through lower contact plugs LCP to the fourth vertical channels VS4 that are adjacent to each other in the second direction D2. In some embodiments, lengths of the third assistant interconnections SBL3 may be greater than lengths of the fourth assistant interconnections SBL4. The first and second assistant interconnections SBL1 and SBL2 may intersect the isolation insulating pattern 50, and the third and fourth assistant interconnections SBL3 and SBL4 may intersect the common source region CSR.

An upper insulating layer 40 may be disposed on the capping insulating layer 30 and the first to fourth assistant interconnections SBL1 to SBL4, and first and second bit lines BL1 and BL2 may be disposed on the upper insulating layer 40. The first and second bit lines BL1 and BL2 may extend in the second direction D2 and may be alternately arranged along the first direction D1.

The first bit lines BL1 may be electrically connected to ones of the first assistant interconnections SBL1 or the second assistant interconnections SBL2 through upper contact plugs UCP. The second bit lines BL2 may be electrically connected to ones of the third assistant interconnections SBL3 or the fourth assistant interconnections SBL4 through upper contact plugs UCP.

Referring to FIGS. 4 and 8, first contact plugs CP1 may penetrate the capping insulating layer 30 and the filling insulation layer 20 of the connection region CNR so as to be connected to the first pad regions P1 of the first electrodes EL1 respectively. Second contact plugs CP2 may penetrate the capping insulating layer 30 and the filling insulation layer 20 of the connection region CNR so as to be connected to the second pad regions P2 of the second electrodes EL2, respectively.

The first contact plugs CP1 may be disposed on the first stair step structure of each of the first and second electrode structures ST1 and ST2, and the second contact plugs CP2 may be disposed on the second stair step structure of each of the first and second electrode structures ST1 and ST2. Thus, ones of the first contact plugs CP1 may be spaced apart from each other and may be arranged in the first direction D1. Bottom surfaces of the ones of the first contact plugs CP1 may be disposed at different heights with respect to the substrate 10. Ones of the second contact plugs CP2 may be spaced apart from each other and may be arranged in the first direction D1. Bottom surfaces of the ones of the second contact plugs CP2 may be disposed at different heights with respect to the substrate 10. In addition, the first contact plugs CP1 connected to the first electrode structure ST1 may be adjacent to respective ones of the first contact plugs CP1 connected to the second electrode structure ST2 in the second direction D2. The second contact plug CP2 connected to the dummy electrode EL2$d$ (i.e., the uppermost second electrode) may be laterally spaced apart from the isolation insulating pattern 50.

First connection lines CL1 and second connection lines CL2 may be disposed on the capping insulating layer 30 of the connection region CNR. The first and second connection lines CL1 and CL2 may extend in the second direction D2 and may be alternately arranged along the first direction D1.

The first connection lines CL1 may be connected to the first contact plugs CP1 arranged in the second direction D2, and the second connection lines CL2 may be connected to the second contact plugs CP2 arranged in the second direction D2. The first connection lines CL1 may be electrically connected to the first electrodes EL1 of the first and second electrode structures ST1 and ST2 that are disposed at the same vertical distance from the substrate 10. In other words, the first electrodes EL1 of the first and second electrode structures ST1 and ST2 that are disposed at the same height may be in an equipotential state. In addition, the second connection lines CL2 may be electrically connected to the second electrodes EL2 of the first and second electrode structures ST1 and ST2 that are disposed at the same vertical distance from the substrate 10. In other words, the second electrodes EL2 of the first and second electrode structures ST1 and ST2 that are disposed at the same height may be in an equipotential state.

In addition, first lower selection lines SCL1$a$ may be connected to the first lower string selection electrodes SSL1$a$ through contact plugs on the connection region CNR, and second lower selection lines SCL1$b$ may be connected to the second lower string selection electrodes SSL1$b$ through contact plugs on the connection region CNR. First upper selection lines SCL2$a$ may be connected to the first upper string selection electrodes SSL2$a$ through contact plugs on the connection region CNR, and second upper selection lines SCL2$b$ may be connected to the second upper string selection electrodes SSL2$b$ through contact plugs on the connection region CNR. The first and second lower selection lines SCL1$a$ and SCL1$b$ and the first and second upper selection lines SCL2$a$ and SCL2$b$ may extend in the first direction D1 on the upper insulating layer 40.

In some embodiments, vertical pillars VP may penetrate the electrode structures ST1 and ST2 on the connection region CNR, as illustrated in FIG. 4. The vertical pillars VP may have substantially the same structure as the vertical channels VS1 to VS4 and DVS of the cell array region CAR. The vertical pillars VP may include a semiconductor material, a conductive material, and/or a dielectric material. In some embodiments, the vertical pillars VP may penetrate end portions of the first and second electrodes EL1 and EL2. The vertical pillars VP may be spaced apart from each other in the first direction D1 and the second direction D2. In some embodiments, some of the vertical pillars VP may be disposed at a boundary between the first pad regions P1 adjacent to each other in the first direction D1 and at a boundary between the second pad regions P2 adjacent to each other in the first direction D1. In some embodiments, some of the vertical pillars VP may be arranged at first distances in the first direction D1, and others of the vertical pillars VP may be arranged at second distances different from the first distance in the first direction D1. For example, the vertical pillars VP constituting a first column along the first direction D1 may be arranged at the first distances. The vertical pillars VP constituting a second column along the first direction D1 may be arranged at the second distances different from the first distance.

In some embodiments, the vertical pillars VP may penetrate the first and second pad regions P1 and P2 of the first and second electrode structures ST1 and ST2, respectively. In some embodiments, one or some of the vertical pillars VP may penetrate the isolation insulating pattern 50 on the connection region CNR. However, embodiments of the inventive concepts are not limited thereto. In some embodiments, the arrangement of the vertical pillars VP may be variously modified. In some embodiments, the vertical pillars VP may be omitted on the connection region CNR.

FIGS. 11 to 16 are plan views illustrating portions of 3D semiconductor memory devices according to some embodiments of the inventive concepts. FIG. 17 is a plan view illustrating a dummy electrode of the 3D semiconductor memory device illustrated in FIG. 16. Hereinafter, the descriptions to the same technical features as in the embodiments of FIGS. 3 to 9 and 10A to 10D may be omitted or mentioned briefly for the purpose of ease and convenience in explanation.

Figure 11:
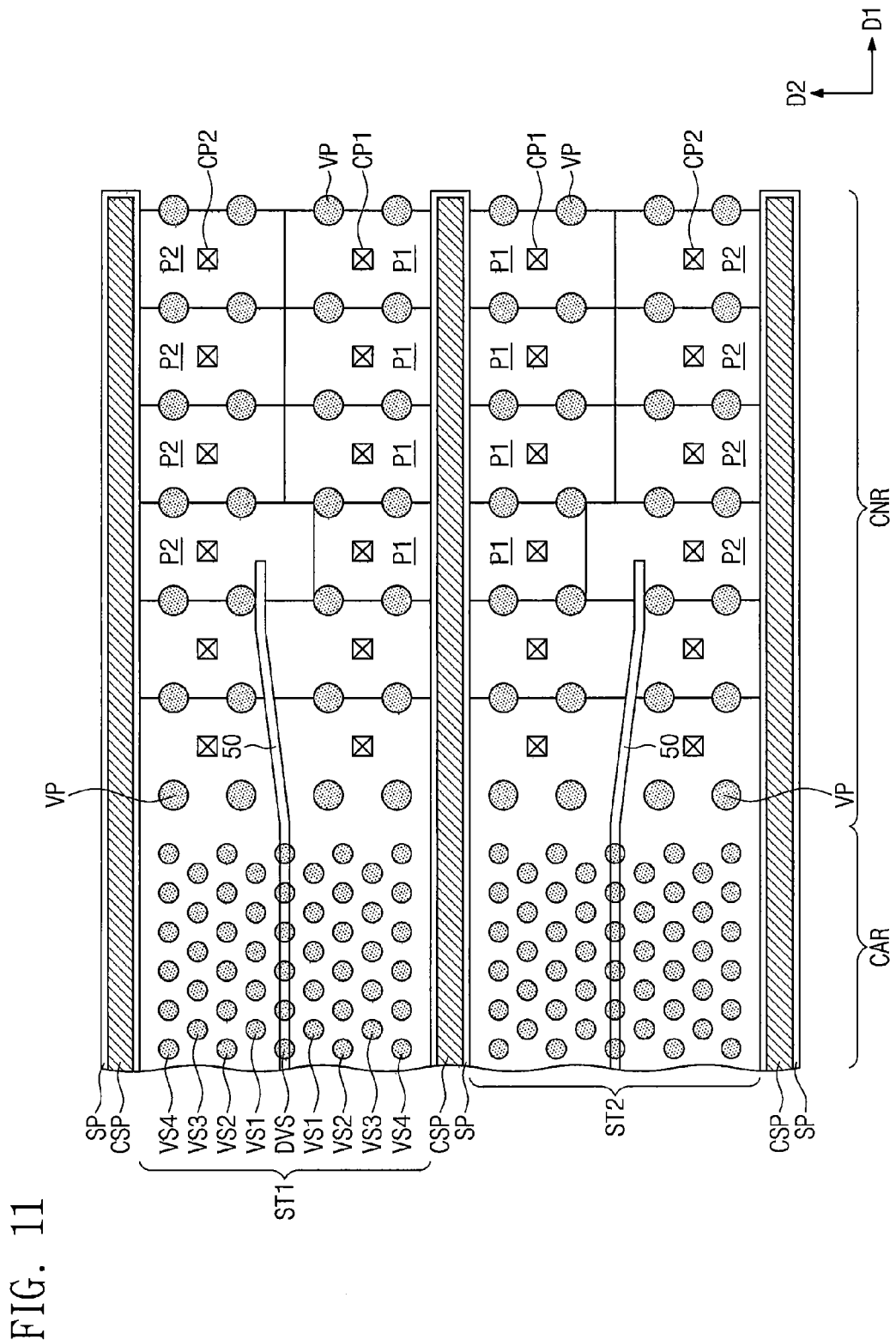
FIGS. 11 to 16 are plan views illustrating portions of 3D semiconductor memory devices according to some embodiments of the inventive concepts.

Referring to FIG. 11, the isolation insulating pattern 50 may have the linear portion (see 50$a$ of FIG. 10D) parallel to the first direction D1 and the bending portion (see 50$b$ of FIG. 10D) forming the specific angle with the first direction D1, as described with reference to FIG. 10D. The bending portion of the isolation insulating pattern 50 may be bent on the connection region CNR and may have a uniform width. In addition, the isolation insulating pattern 50 may be horizontally spaced apart from the uppermost one of the first pad regions P1.

Furthermore, the vertical pillars VP may penetrate the first and second electrode structures ST1 and ST2 and may be arranged along the first direction D1 and the second direction D2. A distance between the vertical pillars VP adjacent to each other in the first direction D1 may be substantially equal to a distance between the vertical pillars VP adjacent to each other in the second direction D2. In other words, the vertical pillars VP may be arranged in a matrix form on the connection region CNR.

Figure 12:
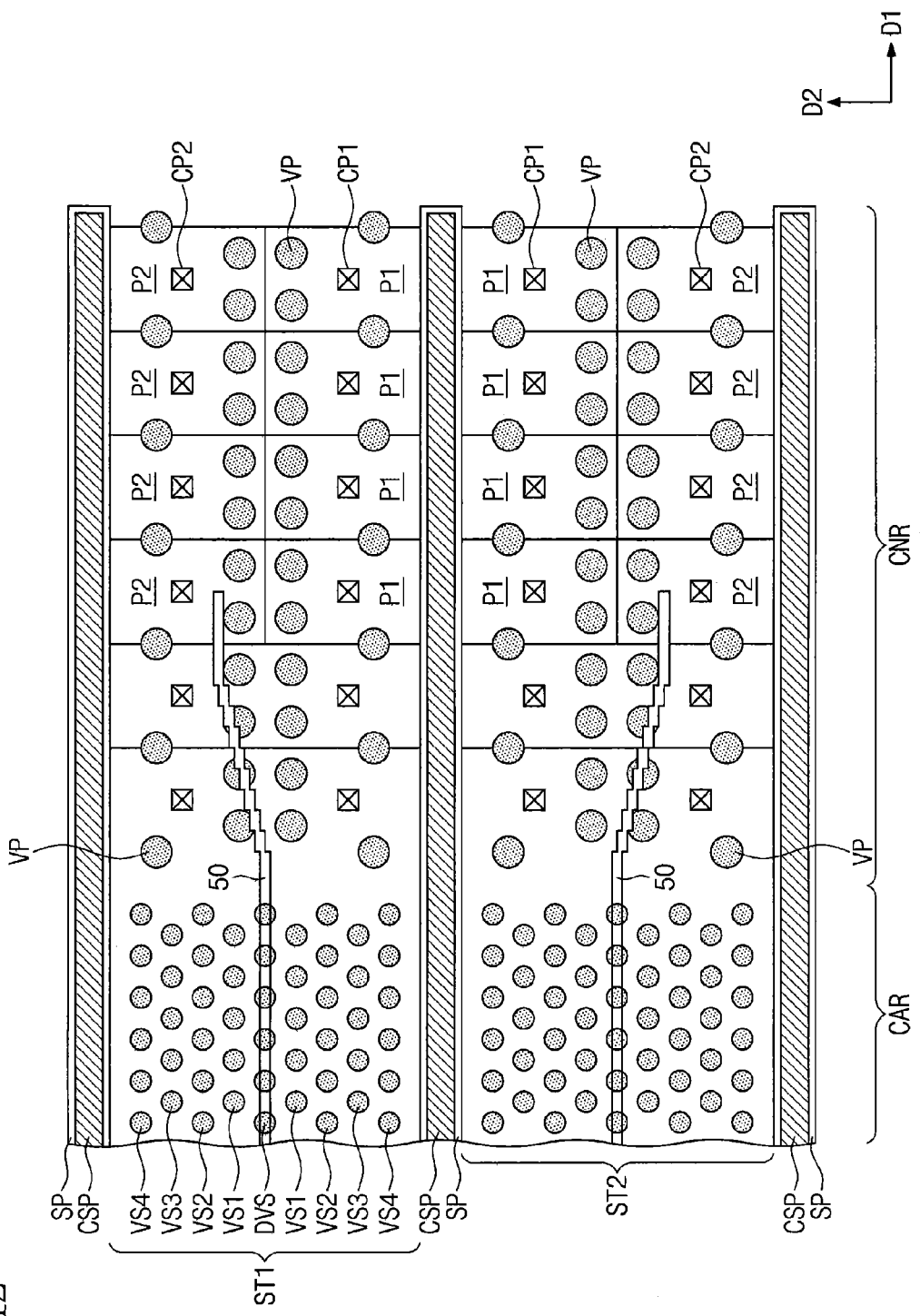

Referring to FIG. 12, widths of the second pad regions P2 of the second electrodes EL2 may be substantially equal to each other in the electrode structures ST1 and ST2. In other words, the width of the second pad region P2 of the dummy electrode (EL2d of FIG. 5, i.e., the uppermost second electrode) may be substantially equal to the widths of the second pad regions P2 of other second electrodes (EL2 of FIG. 5). Likewise, widths of the first pad regions P1 of the first electrodes EL1 may be substantially equal to each other in each of the electrode structures ST1 and ST2.

In addition, the isolation insulating pattern 50 may extend from the cell array region CAR onto the connection region CNR along the first direction D1 and may have a bending portion bent on the connection region CNR. The isolation insulating pattern 50 may penetrate a portion of the second pad region P2 of the dummy electrode EL2d and may be horizontally spaced apart from the uppermost one of the first pad regions P1.

Figure 13:
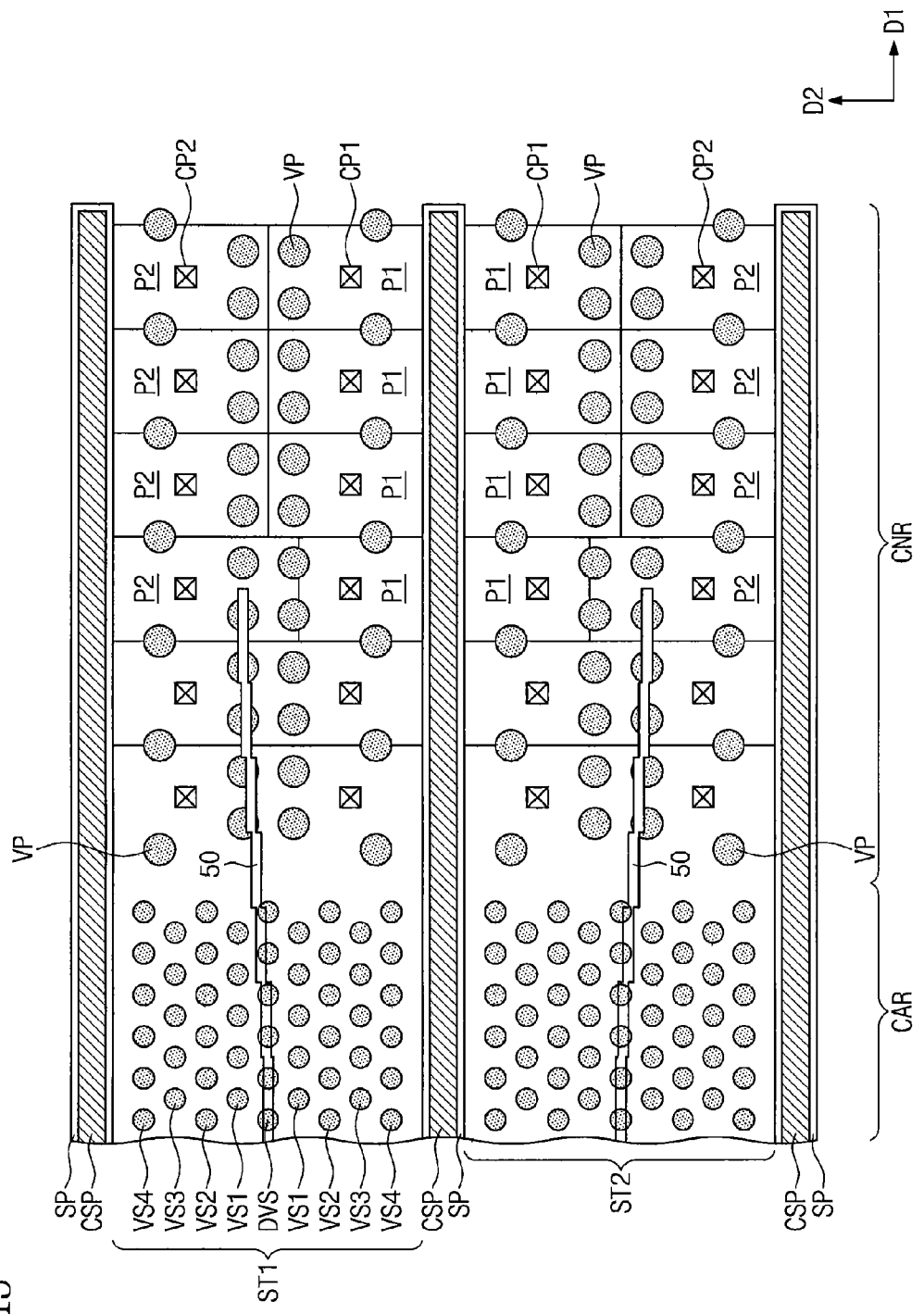
Figure 14:
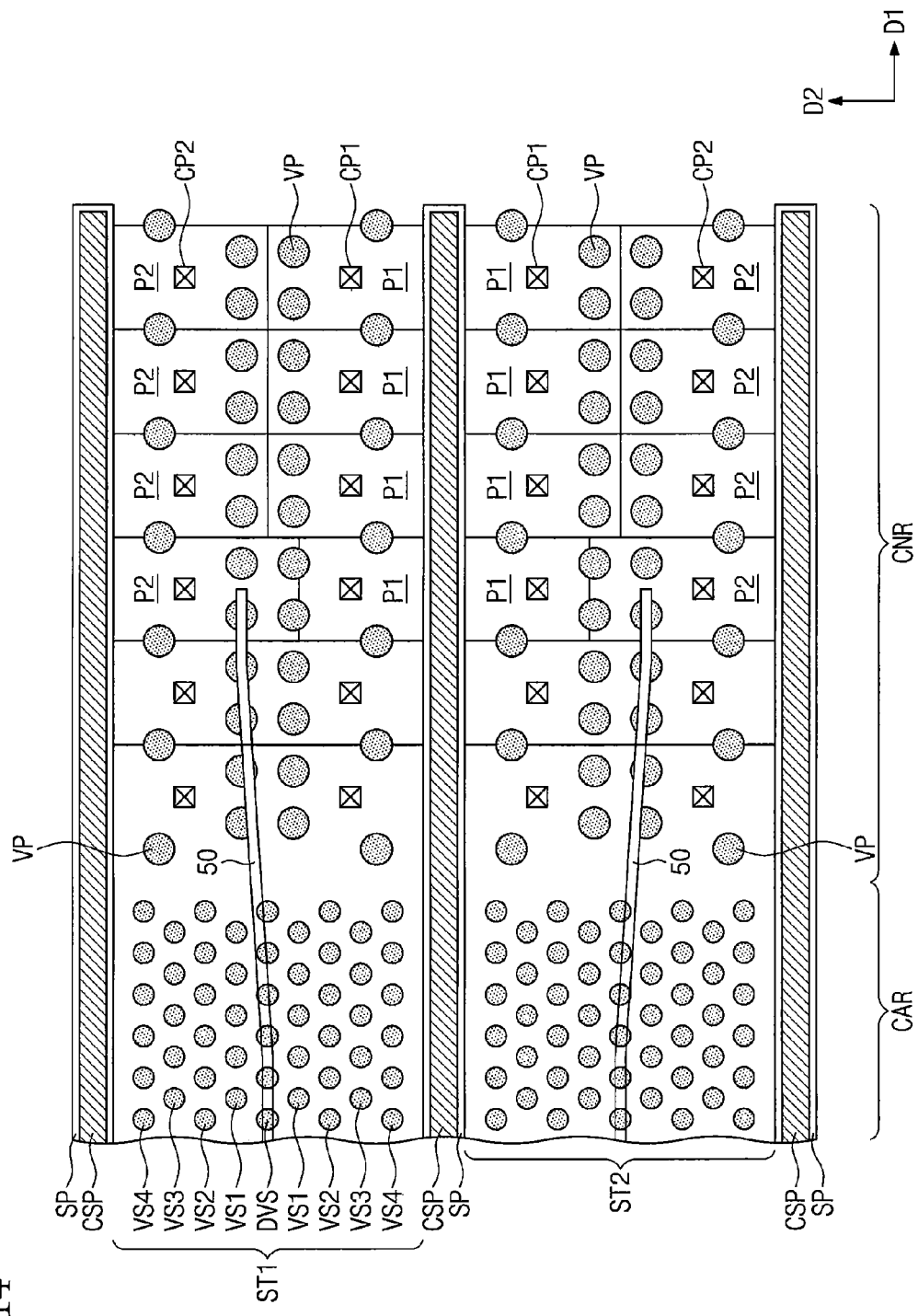

Referring to FIGS. 13 and 14, the isolation insulating pattern 50 may have the linear portion (see 50a of FIG. 10D) parallel to the first direction D1 and the bending portion (see 50b of FIG. 10D) forming the specific angle with the first direction D1, as described with reference to FIG. 10D. In some embodiments, the bending portion of the isolation insulating pattern 50 may be connected to the linear portion on an edge portion of the cell array region CAR. In other words, the bending portion of the isolation insulating pattern 50 may be disposed on some of the dummy vertical channels DVS. Thus, the widths of the first and second string selection electrodes SSLa and SSLb may become different from each other from on the edge portion of the cell array region CAR. Since the bending portion of the isolation insulating pattern 50 is disposed on the edge portion of the cell array region CAR, a length of the bending portion in the first direction D1 may be increased and the bent angle (see θ of FIG. 10D) of the bending portion may be reduced.

Figure 15:
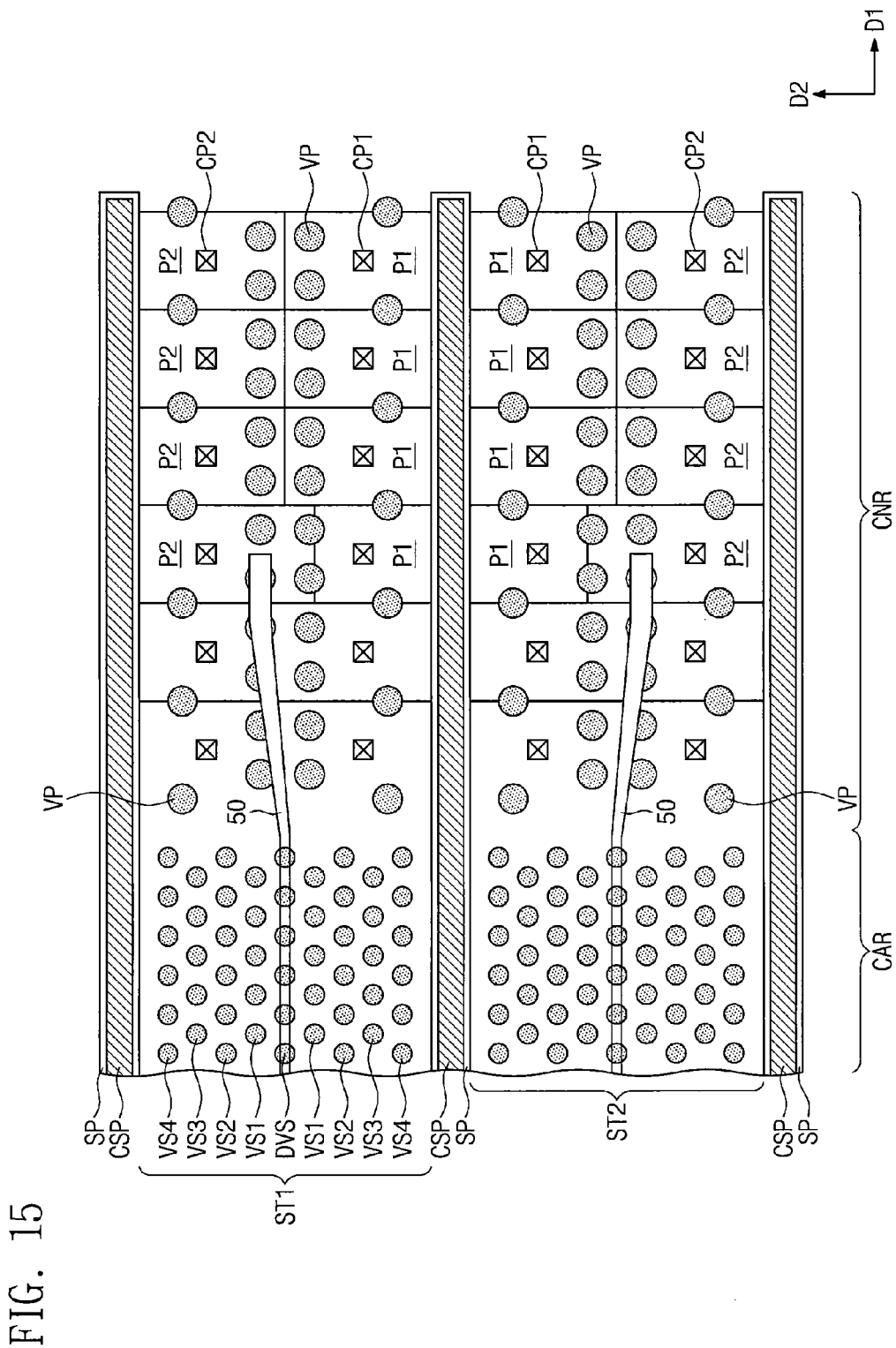

Referring to FIG. 15, a width of the isolation insulating pattern 50 of the cell array region CAR may be different from a width of the isolation insulating pattern 50 of the connection region CNR. In detail, the isolation insulating pattern 50 may include the linear portion parallel to the first direction D1 and the bending portion bent at a specific angle with respect to the first direction D1. The linear portion may have a first width, and a width of the bending portion may become progressively greater toward an end of the isolation insulating pattern 50.

Figure 16:
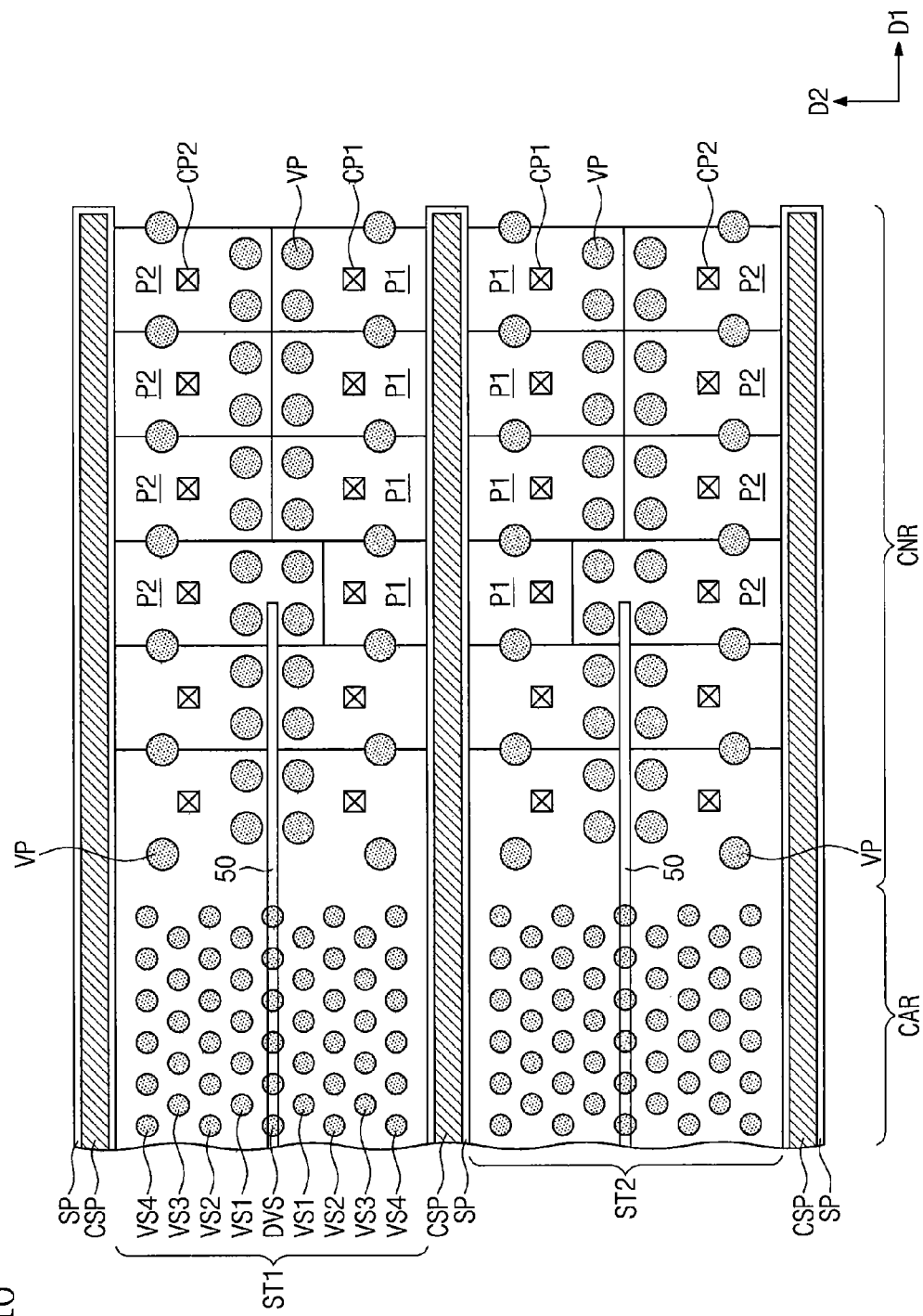
Figure 17:
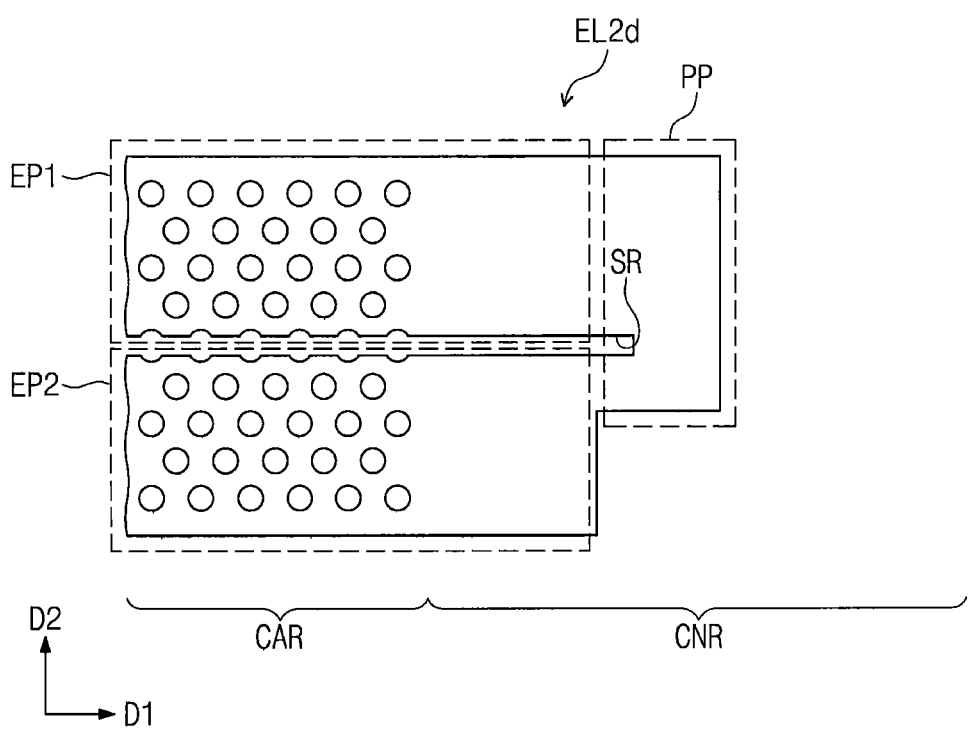
FIG. 17 is a plan view illustrating a dummy electrode of the 3D semiconductor memory device illustrated in FIG. 16.

Referring to FIGS. 16 and 17, the isolation insulating pattern 50 may linearly extend from the cell array region CAR onto the connection region CNR along the first direction D1. In other words, the isolation insulating pattern 50 may have a linear shape on the connection region CNR and may penetrate a portion of the dummy electrode EL2d on the connection region CNR. In some embodiments, the width of the uppermost one of the second pad regions P2 may be greater than the widths of others of the second pad regions P2 in each of the electrode structures ST1 and ST2. Thus, the linear isolation insulating pattern 50 may be horizontally spaced apart from the uppermost one of the first pad regions P1. As a result, it is possible to prevent the dummy electrode EL2d from being completely divided into linear segments by the isolation insulating pattern 50.

Figure 18:
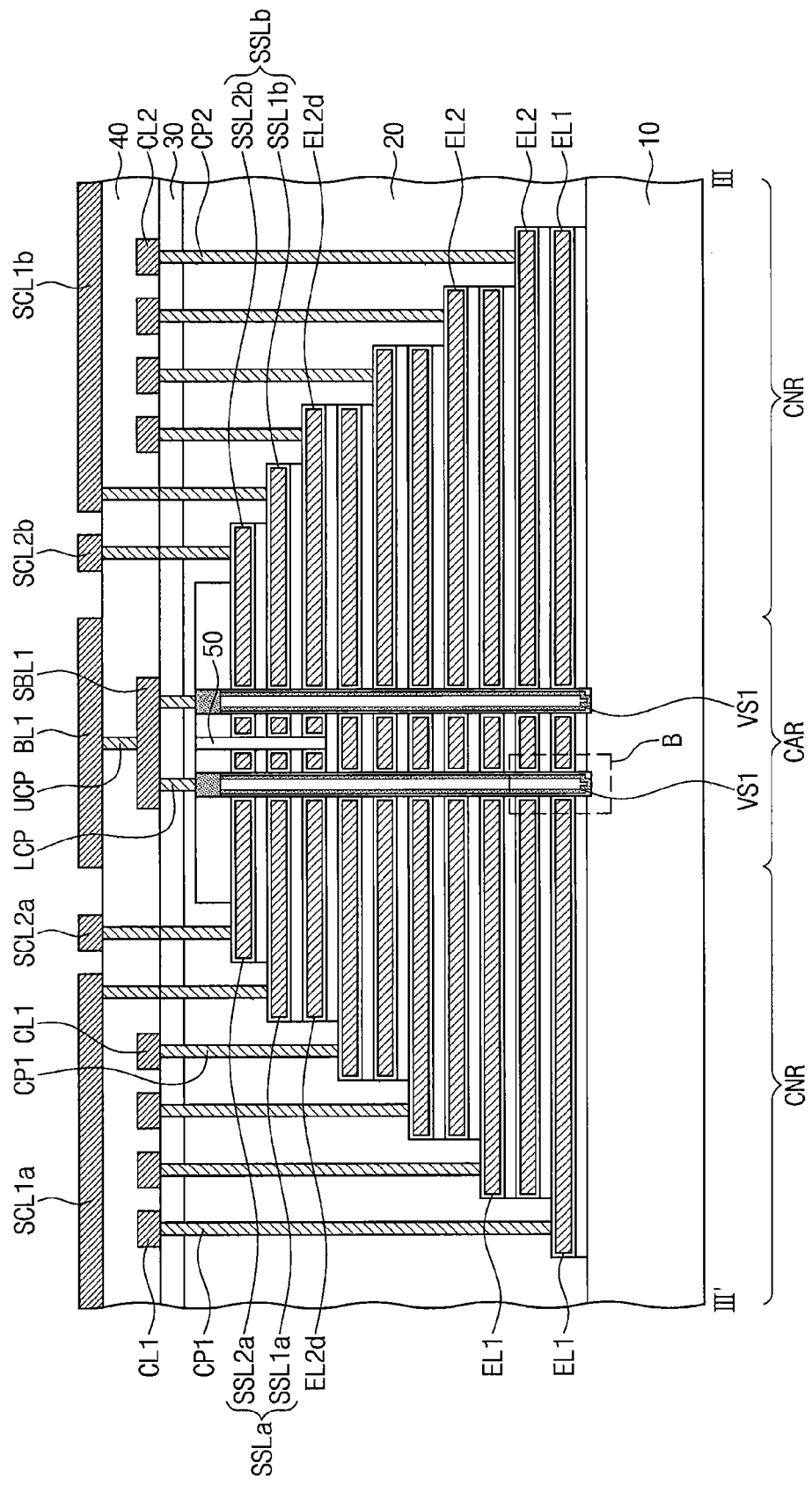
FIG. 18 is a cross-sectional view taken along a line III-III' of FIG. 4 to illustrate a portion of a 3D semiconductor memory device according to some embodiments of the inventive concepts.
Figure 19:
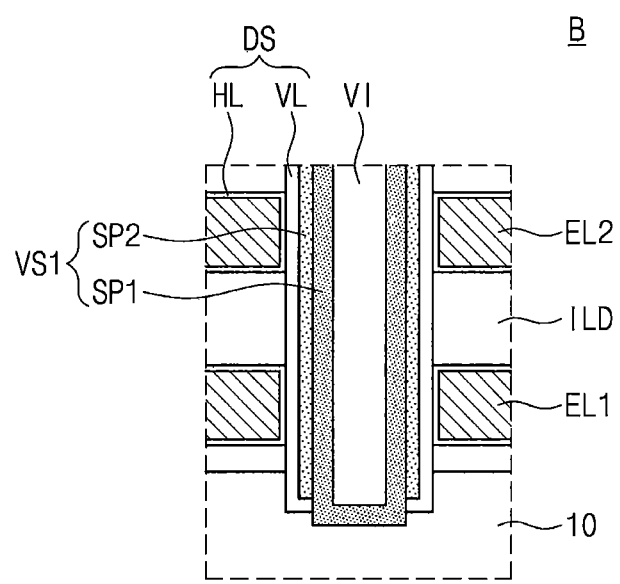
FIG. 19 is an enlarged view of a portion 'B' of FIG. 18.

FIG. 18 is a cross-sectional view taken along a line III-III' of FIG. 4 to illustrate a portion of a 3D semiconductor memory device according to some embodiments of the inventive concepts. FIG. 19 is an enlarged view of a portion 'B' of FIG. 18. Hereinafter, the descriptions to the same technical features as in the embodiments of FIGS. 3 to 9 and 10A to 10D may be omitted or mentioned briefly for the purpose of ease and convenience in explanation.

Referring to FIGS. 18 and 19, first to fourth vertical channels (see VS1 to VS4 of FIG. 3) may penetrate the first and second electrode structures ST1 and ST2. Ones of the first to fourth vertical channels VS1 to VS4 may include a first semiconductor pattern SP1 being in contact with the substrate 10 and a second semiconductor pattern SP2 disposed between the first semiconductor pattern SP1 and a data storage layer DS.

The first semiconductor pattern SP1 may have a hollow pipe shape or a hollow macaroni shape. A bottom end of the first semiconductor pattern SP1 may be closed, and the inner space of the first semiconductor pattern SP1 may be filled with a filling insulation pattern VI. Alternatively, the first semiconductor pattern SP1 may have a pillar shape having a circular horizontal cross section.

The first semiconductor pattern SP1 may be in contact with an inner sidewall of the second semiconductor pattern SP2 and the top surface of the substrate 10. In other words, the first semiconductor pattern SP1 may electrically connect the second semiconductor pattern SP2 to the substrate 10. A bottom surface of the first semiconductor pattern SP1 may be disposed at a lower level than the top surface of the substrate 10.

The second semiconductor pattern SP2 may have a pipe or macaroni shape of which top and bottom ends are opened. A bottom surface of the second semiconductor pattern SP2 may be higher than the bottom surface of the first semiconductor pattern SP1 and may be spaced apart from the substrate 10. Alternatively, the second semiconductor pattern SP2 may be in direct contact with the substrate 10.

The first and second semiconductor patterns SP1 and SP2 may be undoped or may be doped with dopants having the same conductivity type as the substrate 10. The first and second semiconductor patterns SP1 and SP2 may be in a poly-crystalline state or a single-crystalline state.

Figure 20:
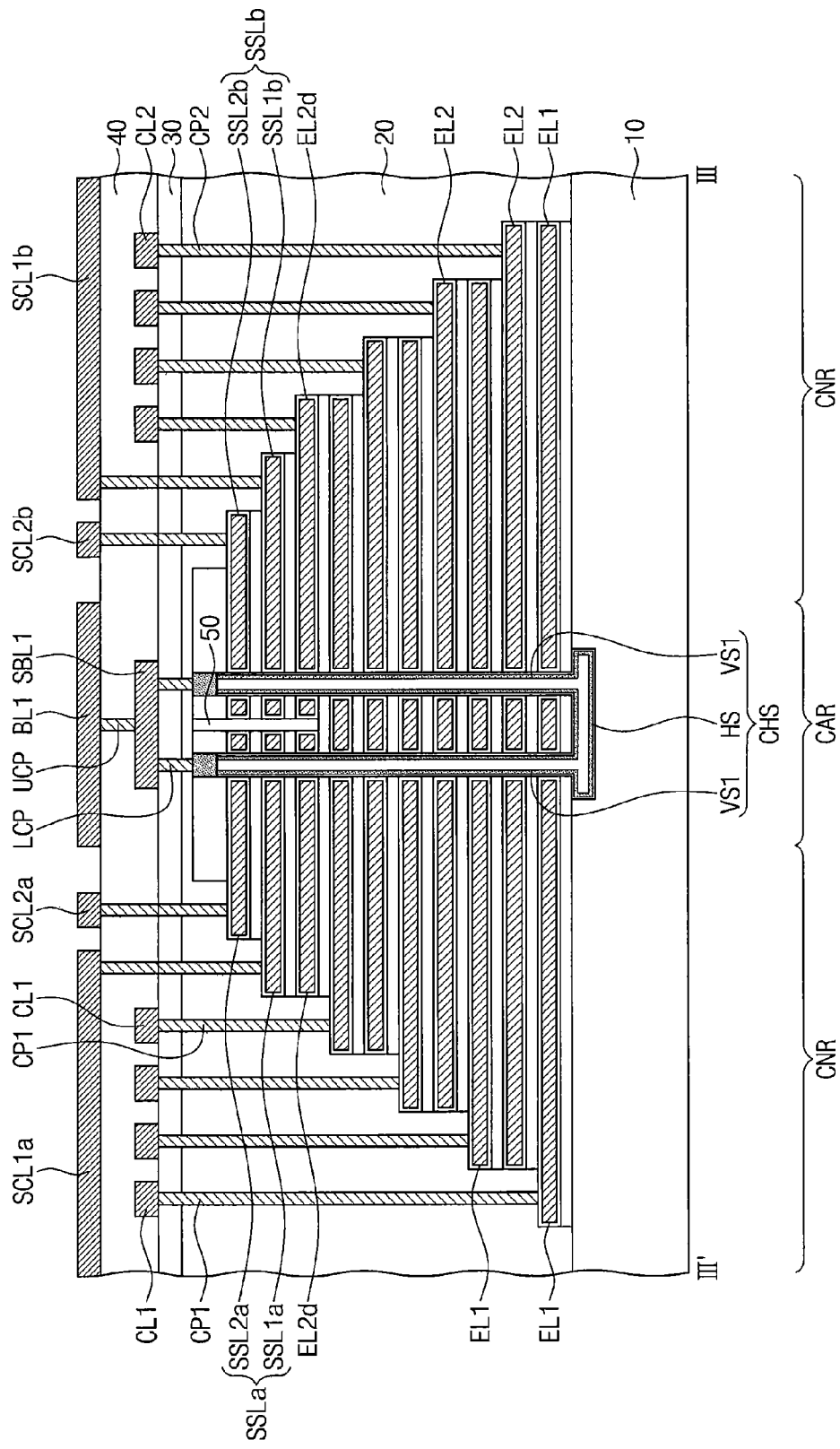
FIG. 20 is a cross-sectional view taken along a line III-III' of FIG. 4 to illustrate a portion of a 3D semiconductor memory device according to some embodiments of the inventive concepts.

FIG. 20 is a cross-sectional view taken along a line III-III' of FIG. 4 to illustrate a portion of a 3D semiconductor memory device according to some embodiments of the inventive concepts. Hereinafter, the descriptions to the same technical features as in the embodiments of FIGS. 3 to 9 and 10A to 10D may be omitted or mentioned briefly for the purpose of ease and convenience in explanation.

Referring to FIG. 20, channel structures CHS may penetrate first and second electrode structures (see ST1 and ST2 of FIG. 5). The channel structures CHS may include vertical channels VS1 penetrating the electrode structures ST1 and ST2 and a horizontal channel HS disposed under the electrode structures ST1 and ST2 to connect the vertical channels VS1 to each other. The vertical channels VS1 may be provided in vertical holes penetrating the electrode structures ST1 and ST2. The horizontal channel HS may be provided in a recess region formed in an upper portion of the substrate 10. The horizontal channel HS may be disposed between the substrate 10 and the electrode structures ST1 and ST2 to connect the vertical channels VS1 to each other.

In some embodiments, the horizontal channel HS may have a hollow pipe or macaroni shape continuously connected to the vertical channels VS1. In other words, the vertical channels VS1 and the horizontal channel HS may constitute a pipe shape of one body. That is, the vertical channels VS1 and the horizontal channel HS may constitute one semiconductor layer continuously extending without an interface therebetween. The semiconductor layer may be formed of a semiconductor material having a crystal structure including at least one of a single-crystalline structure, an amorphous structure, or a poly-crystalline structure.

FIGS. 21 to 24 are perspective views illustrating methods of forming electrode structures of 3D semiconductor memory devices according to some embodiments of the inventive concepts.

Figure 21:
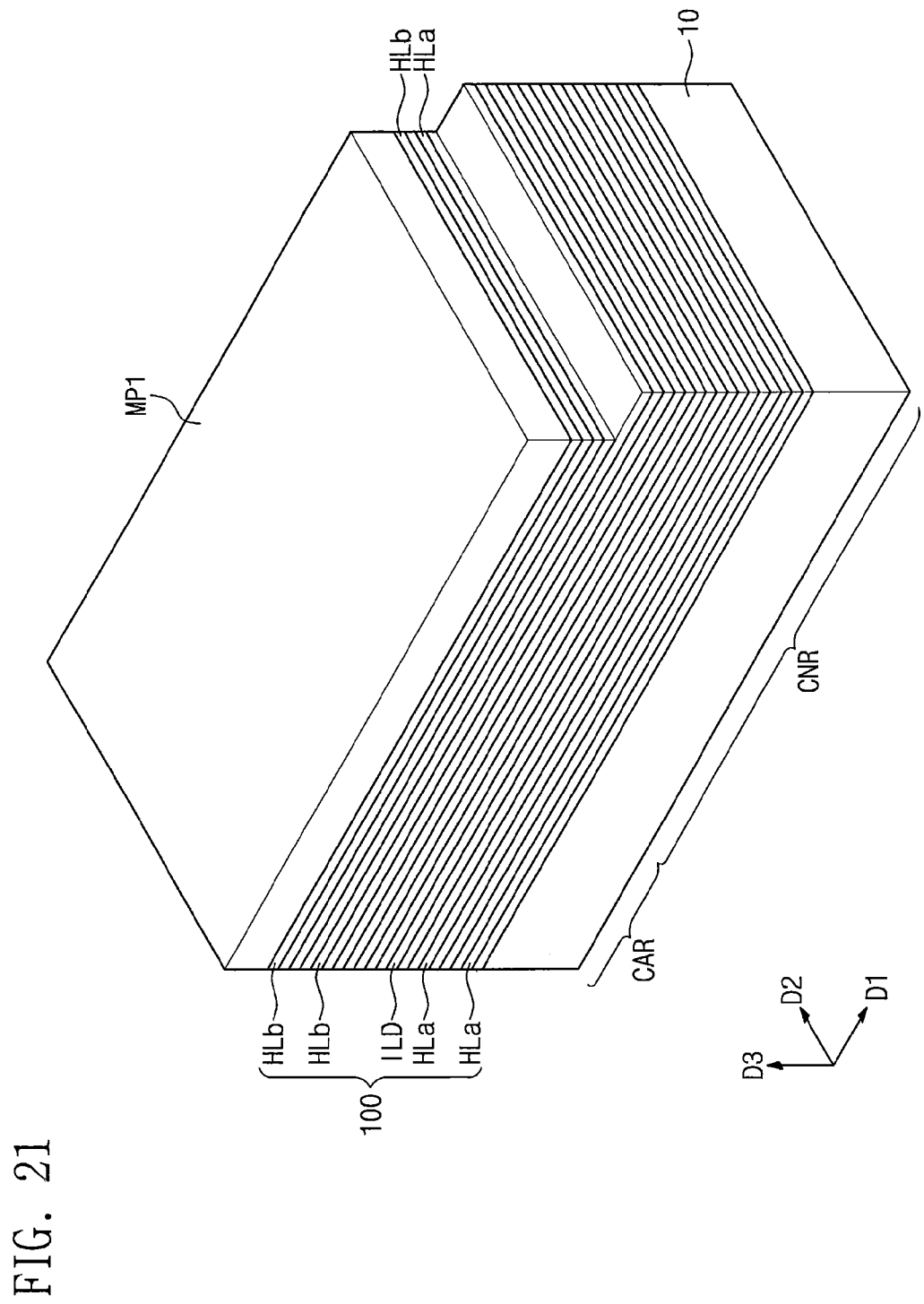
FIGS. 21 to 24 are perspective views illustrating methods of forming electrode structures of 3D semiconductor memory devices according to some embodiments of the inventive concepts.

Referring to FIG. 21, a thin layer structure 100 may be formed on a substrate 10 including a cell array region CAR and a connection region CNR. The thin layer structure 100 may include insulating layers ILD and horizontal layers HLa and HLb which are vertically and alternately stacked on the substrate 10. In some embodiments, the first and second electrodes EL1 and EL2 described with reference to FIGS. 1 to 20 may be formed by a patterning method to be described hereinafter. In other words, the horizontal layers HLa and HLb may be used to form the first and second electrodes EL1 and EL2 according to some embodiments of the inventive concepts.

The horizontal layers HLa and HLb may be formed of a material having an etch selectivity with respect to the insulating layers ILD. For example, the insulating layers ILD may be a silicon oxide layer, and the horizontal layers HLa and HLb may include at least one of a silicon nitride layer, a silicon oxynitride layer, a poly-crystalline silicon layer, and/or a metal layer. In some embodiments, the horizontal layers HLa and HLb may be formed of the same material as each other.

A first mask pattern MP1 may be formed on the thin layer structure 100. The first mask pattern MP1 may expose a portion of the thin layer structure 100 of the connection region CNR.

Next, an etching process and a trimming process may be alternately repeated. A portion of the thin layer structure 100 may be etched using the first mask pattern MP1 as an etch mask in the etching process, and the first mask pattern MP1 may be shrunken in the trimming process. A plurality of the horizontal layers exposed by the first mask pattern MP1 may be etched in the etching process. In other words, an etch depth of the etching process may be equal to or greater than twice a vertical pitch of the horizontal layers HLa and HLb. As used herein, the vertical pitch of the horizontal layers HLa and HLb refers to a vertical distance between top surfaces of the horizontal layers HLa and HLb that are vertically adjacent to each other. One sidewall of the first mask pattern MP1 may be horizontally moved by a specific distance toward the cell array region CAR during the trimming process, and thus an area of the first mask pattern MP1 may be reduced. The horizontal movement distance of the sidewall of the first mask pattern MP1 may correspond to a width, in the first direction D1, of each of the first and second pad regions P1 and P2 of the first and second electrodes EL1 and EL2 described above.

Figure 22:
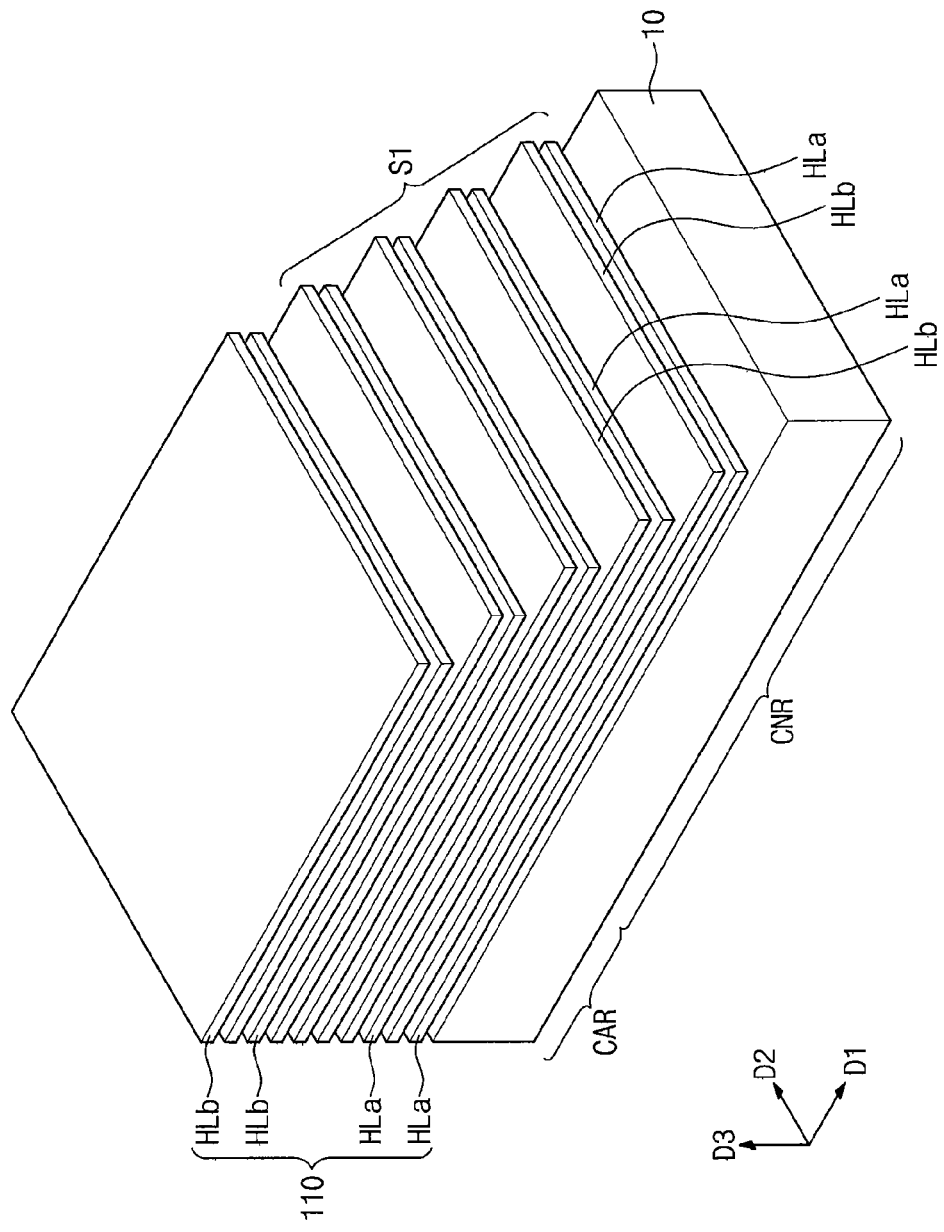

Referring to FIG. 22, the trimming process of the first mask pattern MP1 and the etching process of the thin layer structure 100 may be alternately repeated to form a first stack structure 110 having a first stair step structure S1 in which end portions of even-numbered horizontal layers HLb are exposed. The first stack structure 110 may have the first stair step structure S1 formed by the exposed end portions of the even-numbered horizontal layers HLb on the connection region CNR.

Figure 23:
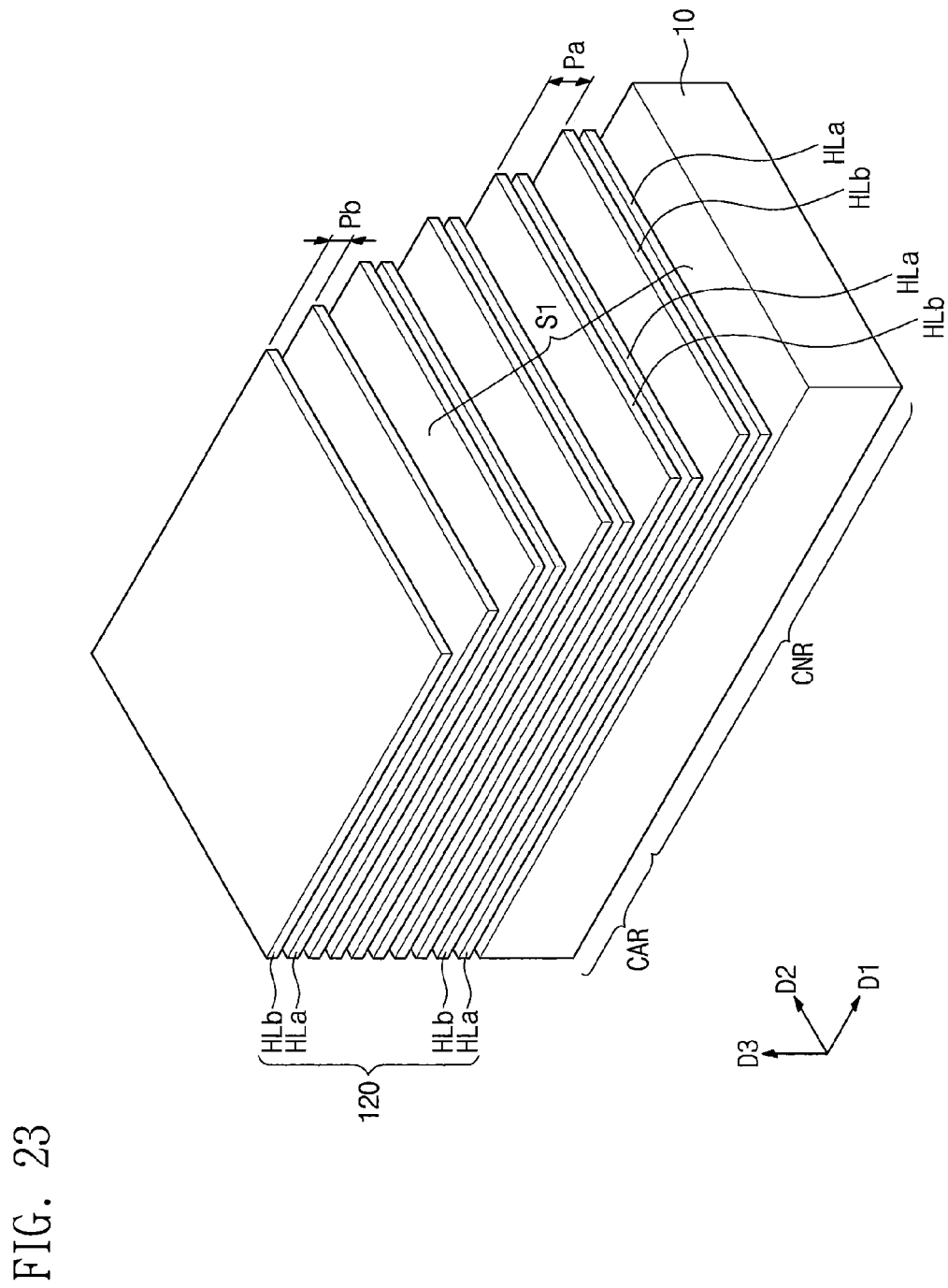

Referring to FIG. 23, a portion of the uppermost horizontal layer HLb may be patterned to form a second stack structure 120. In the second stack structure 120, the uppermost horizontal layer HLb may expose an end portion of a next uppermost horizontal layer HLa disposed under the uppermost horizontal layer HLb. In the second stack structure 120, the end portions of the even-numbered horizontal layers HLb may be spaced apart from each other by a first vertical pitch Pa. The end portion of the uppermost one of odd-numbered horizontal layers HLa may be spaced apart from the end portion of the uppermost one of the even-numbered horizontal layers HLb by a second vertical pitch Pb. The second vertical pitch Pb may be about a half of the first vertical pitch Pa.

Figure 24:
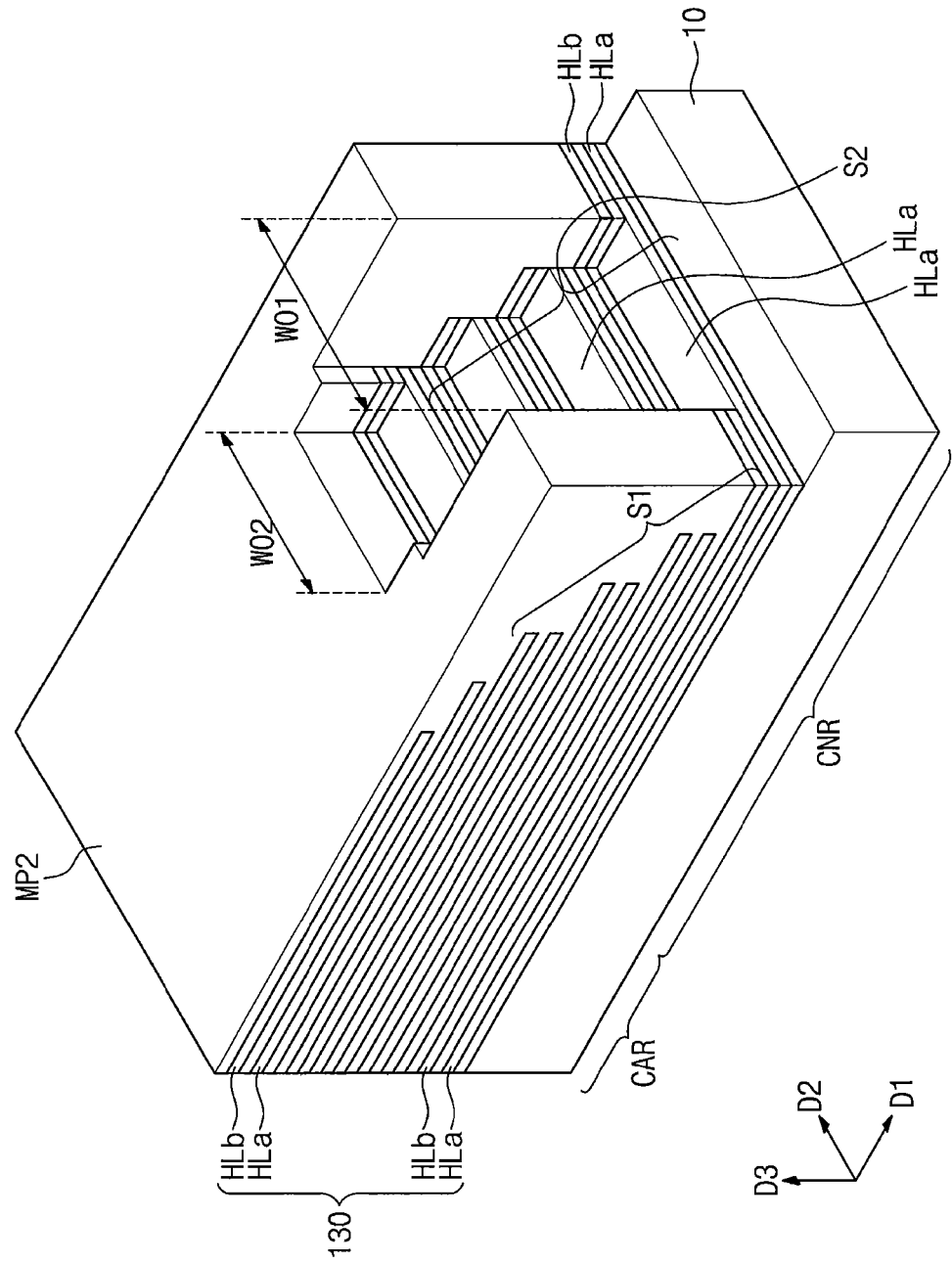

Referring to FIG. 24, a second mask pattern MP2 may be formed on the second stack structure 120 having the first stair step structure S1. The second mask pattern MP2 may have an opening exposing a portion of the first stair step structure S1 of the second stack structure 120.

In some embodiments, the opening of the second mask pattern MP2 may have a first open width WO1 and a second open width WO2 smaller than the first opening width WO1. In the second mask pattern MP2, a portion having the second open width WO2 may expose the end portion of the uppermost horizontal layer HLb of the first stair step structure S1.

A portion of the first stair step structure S1 may be etched using the second mask pattern MP2 as an etch mask to form a third stack structure 130. An etch depth of the etching process using the second mask pattern MP2 as an etch mask may be smaller than the etch depth of the etching process using the first mask pattern (MP1 of FIG. 18) as an etch mask. For example, the etch depth of the etching process using the second mask pattern MP2 may be substantially equal to the vertical pitch of the horizontal layers HLa and HLb. Thus, portions of the even-numbered horizontal layers HLb exposed by the second mask pattern MP2 may be etched to form the third stack structure 130 of which end portions of the odd-numbered horizontal layers HLa are exposed. In other words, a second stair step structure S2 realized by the exposed end portions of the odd-numbered horizontal layers HLb may be formed on the connection region CNR. That is, the third stack structure 130 may have the first stair step structure S1 and the second stair step structure S2 on the connection region CNR. The first and second stair step structures S1 and S2 may be adjacent to each other in the second direction D2.

The second mask pattern MP2 may be removed after the formation of the third stack structure 130. Linear mask patterns extending in the first direction D1 may be formed on the third stack structure 130. The third stack structure 130 may be etched using the linear mask patterns as etch masks to form electrode structures spaced apart from each other in the second direction D2.

According to some embodiments of the inventive concepts, the electrode structure may include the first and second electrodes vertically and alternately stacked on the substrate. The electrode structure may extend in one direction on the cell array region and may have the first stair step structure formed by the end portions of the first electrodes and the second stair step structure formed by the end portions of the second electrodes on the connection region. The first stair step structure and the second stair step structure may be adjacent to each other in a direction (i.e., a short-axis direction) perpendicular to the extending direction (i.e., a long-axis direction) of the first and second electrodes.

The first and second string selection electrodes laterally spaced apart from each other may be disposed on the electrode structure. The first and second string selection electrodes may be laterally separated from each other on the electrode structure by the isolation insulating pattern which extends in one direction on the cell array region and is bent on the connection region.

Since the isolation insulating pattern has the bent structure on the connection region, it is possible to prevent the dummy electrode disposed under the first and second string selection electrodes from being completely divided.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A three-dimensional (3D) semiconductor memory device comprising:
   a substrate comprising a cell array region and a connection region;
   an electrode structure comprising pluralities of first and second electrodes that are vertically and alternately stacked on a surface of the substrate, the electrode structure extending in a first direction that is parallel to the surface of the substrate and the electrode structure comprising a stair step structure on the connection region; and
   first and second string selection electrodes that extend in the first direction on the electrode structure, the first and second string selection electrodes being spaced apart from each other in a second direction that is parallel to the surface of the substrate and perpendicular to the first direction,
   wherein the first and second string selection electrodes each comprise an electrode portion on the cell array region and a pad portion extending from the electrode portion in the first direction on the connection region, and
   wherein widths in the second direction of the pad portions are different from widths in the second direction of the respective electrode portions.

2. The 3D semiconductor memory device of claim 1,
   wherein the widths of the electrode portions of the first and second string selection electrodes are substantially equal to each other, and
   wherein the width of the pad portion of the first string selection electrode is different from the width of the pad portion of the second string selection electrode.

3. The 3D semiconductor memory device of claim 1,
   wherein the width of the pad portion of the first string selection electrode decreases as a distance from the electrode portion of the first string selection electrode increases, and
   wherein the width of the pad portion of the second string selection electrode increases as a distance from the electrode portion of the second string selection electrode increases.

4. The 3D semiconductor memory device of claim 1, wherein a distance between the electrode portions of the first and second string selection electrodes is substantially equal to a distance between the pad portions of the first and second string selection electrodes.

5. The 3D semiconductor memory device of claim 1,
   wherein the electrode structure has first and second sidewalls opposite to each other that extend in the first direction,
   wherein the first string selection electrode has a sidewall that is aligned with the first sidewall of the electrode structure, and
   wherein the second string selection electrode has a sidewall that is aligned with the second sidewall of the electrode structure.

6. The 3D semiconductor memory device of claim 1,
   wherein ones of the first electrodes comprise a first pad region on the connection region, the first pad region being exposed by an adjacent second electrode,
   wherein ones of the second electrodes comprise a second pad region on the connection region, the second pad region being exposed by an adjacent first electrode, and
   wherein the second pad regions of the ones of the second electrodes are adjacent in the second direction to the first pad regions of respective ones of the first electrodes.

7. The 3D semiconductor memory device of claim 6,
   wherein an uppermost layer of the electrode structure comprises an uppermost second electrode, and
   wherein the first and second string selection electrodes expose the second pad region of the uppermost second electrode.

8. The 3D semiconductor memory device of claim 7, wherein a width of the second pad region of the uppermost second electrode is greater than widths of the second pad regions of others of the second electrodes.

9. The 3D semiconductor memory device of claim 1, wherein an uppermost layer of the electrode structure comprises an uppermost second electrode, the uppermost second electrode comprising:
   first and second electrode portions that extend in the first direction on the cell array region, the first and second electrode portions spaced apart from each other in the second direction; and
   a protrusion on the connection region to horizontally connect the first and second electrode portions,
   wherein the uppermost second electrode exposes a portion of an adjacent first electrode.

10. The 3D semiconductor memory device of claim 9,
    wherein the first electrode portion of the uppermost second electrode comprises a first width in the second direction that is the same as a first width in the second direction of the second electrode portion of the uppermost second electrode,
    wherein the protrusion of the uppermost second electrode has a second width in the second direction, and
    wherein the second width is greater than the first width.

11. The 3D semiconductor memory device of claim 9,
    wherein the first electrode portion of the uppermost second electrode overlaps the first string selection electrode as viewed from a plan view, and
    wherein the second electrode portion of the uppermost second electrode overlaps the second string selection electrode as viewed from a plan view.

12. The 3D semiconductor memory device of claim 9,
    wherein the uppermost second electrode comprises an isolation region horizontally separating the first and second electrode portions from each other, and
    wherein a length of the isolation region of the uppermost second electrode in the first direction is greater than lengths of the first and second string selection electrodes in the first direction.

13. The 3D semiconductor memory device of claim 1, wherein an uppermost layer of the electrode structure comprises an uppermost second electrode, wherein the 3D semiconductor memory device further comprises an isolation insulating pattern between the first and second string selection electrodes, the isolation insulating pattern penetrating the uppermost second electrode, wherein the isolation insulating pattern comprises a linear portion that extends in the first direction on the cell array region and a bending portion that extends from the linear portion on the connection region, the bending portion being bent with respect to the linear portion.

14. The 3D semiconductor memory device of claim 1, further comprising:

first vertical channels on the cell array region that penetrate the first string selection electrode and the electrode structure;

second vertical channels on the cell array region that penetrate the second string selection electrode and the electrode structure; and dummy vertical channels between the first and second string selection electrodes on the cell array region, the dummy vertical channels penetrating the electrode structure.

15. A three-dimensional (3D) semiconductor memory device comprising:

a substrate comprising a cell array region and a connection region; and an electrode structure comprising pluralities of first and second electrodes that are vertically and alternately stacked on a surface of the substrate, the electrode structure extending in a first direction that is parallel to the surface of the substrate and the electrode structure comprising a stair step structure on the connection region, wherein ones of the first electrodes comprise a first pad region on the connection region, the first pad region being exposed by an adjacent second electrode, wherein ones of the second electrodes comprise a second pad region on the connection region, the second pad region being exposed by an adjacent first electrode, wherein the second pad regions of the ones of the second electrodes are adjacent, in a second direction that is parallel to the surface of the substrate and perpendicular to the first direction, to the first pad regions of respective ones of the first electrodes, wherein an uppermost layer of the electrode structure comprises an uppermost second electrode, and wherein a width of the second pad region of the uppermost second electrode is greater than widths of the second pad regions of others of the second electrodes.

16. The 3D semiconductor memory device of claim 15, wherein the second electrodes of the electrode structure each comprise an electrode portion comprising a first width and extending in the first direction and a protrusion comprising a width that is smaller than the first width and extending from the electrode portion in the first direction, and wherein the width of the protrusion of the uppermost second electrode is greater than the widths of the protrusions of others of the second electrodes.

17. The 3D semiconductor memory device of claim 16, wherein the protrusion of each of the ones of the second electrodes has one sidewall that is aligned with one sidewall of the first electrode under each of the second electrodes.

18. The 3D semiconductor memory device of claim 16, wherein the electrode portion of the uppermost second electrode is divided into first and second electrode portions that extend in the first direction and are spaced apart from each other in the second direction on the cell array region, and wherein the protrusion of the uppermost second electrode horizontally connects the first and second electrode portions to each other in the second direction on the connection region.

19. The 3D semiconductor memory device of claim 18, wherein widths of the first and second electrode portions of the uppermost second electrode are substantially equal to each other on the cell array region, and wherein widths of the first and second electrode portions of the uppermost second electrode are different from each other on the connection region.

20. The 3D semiconductor memory device of claim 15, further comprising:

an isolation insulating pattern penetrating the uppermost second electrode, wherein a length, in the first direction, of the isolation insulating pattern is less than a length, in the first direction, of the uppermost second electrode.

* * * * *